(12) United States Patent
Tanaka

(10) Patent No.: US 8,197,601 B2
(45) Date of Patent: Jun. 12, 2012

(54) VAPORIZER, VAPORIZATION MODULE AND FILM FORMING APPARATUS

(75) Inventor: Sumi Tanaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 388 days.

(21) Appl. No.: 12/563,672

(22) Filed: Sep. 21, 2009

(65) Prior Publication Data

US 2010/0006033 A1   Jan. 14, 2010

Related U.S. Application Data

(63) Continuation of application No. PCT/JP2008/054118, filed on Mar. 7, 2008.

(30) Foreign Application Priority Data

Mar. 20, 2007   (JP) ................................. 2007-073464

(51) Int. Cl.
    *C23C 16/00* (2006.01)
(52) U.S. Cl. ....................................... 118/726; 118/727
(58) Field of Classification Search .................. 118/726, 118/727
    See application file for complete search history.

(56) References Cited

U.S. PATENT DOCUMENTS

| 4,714,091 | A | 12/1987 | Wagner | |
|---|---|---|---|---|
| 2006/0141169 | A1* | 6/2006 | Noguchi et al. | ............. 427/585 |

FOREIGN PATENT DOCUMENTS

| JP | 62-002081 | 1/1987 |
|---|---|---|
| JP | 03-126872 | 5/1991 |
| JP | 07-094426 | 4/1995 |
| JP | 2000-058528 | 2/2000 |
| JP | 3118493 | 10/2000 |
| JP | 2001-153299 | 6/2001 |
| JP | 2001-262350 | 9/2001 |
| JP | 2002-173778 | 6/2002 |
| JP | 2005-109349 | 4/2005 |
| JP | 2007-046084 | 2/2007 |

* cited by examiner

*Primary Examiner* — Keath Chen
(74) *Attorney, Agent, or Firm* — Oblon, Spivak, McClelland, Maier & Neustadt, L.L.P.

(57) ABSTRACT

A vaporizer (300) is formed by connecting block-shaped vaporization modules (310). Each vaporization module has a discharge opening for a liquid source material; a vaporization chamber (370) for vaporizing the liquid source material, which is discharged from the discharge opening, to create a source gas; a liquid material flow path (320) formed so as to penetrate through joint surfaces connected to other vaporization modules; and a spray nozzle communicating with a portion in the middle of the liquid material flow path and leading the liquid source material, which flows in the flow path, to the discharge opening. Each vaporization module is connected at its joint surface to each of the other vaporization modules to cause the liquid material flow paths of all the vaporization modules to communicate with one another. When various flow rates ranging from low to high levels is required, the structure of the evaporator can be easily changed according to such rates without a reduction in evaporation efficiency.

22 Claims, 14 Drawing Sheets

VAPORIZER, VAPORIZATION MODULE AND FILM FORMING APPARATUS

This application is a Continuation Application of PCT International Application No. PCT/JP2008/054118 filed on Mar. 7 2008, which designated the United States.

FIELD OF THE INVENTION

The present invention relates to a vaporizer for generating a source gas by vaporizing a liquid source material, a vaporization module for forming the vaporizer, and a film forming apparatus including the vaporizer.

BACKGROUND OF THE INVENTION

Generally, as for a method for forming various thin films made of a dielectric material, a metal, a semiconductor or the like, there is known a CVD (chemical vapor deposition) method for forming a film by supplying an organic material gas such as an organic metal compound or the like to a film forming chamber and causing a reaction between the organic material gas and another gas such as oxygen, ammonia or the like. An organic material used in the CVD method often exists in a liquid or a solid state at a room temperature, so that a vaporizer for vaporizing the organic material is required. The organic material becomes a liquid source material by, e.g., dilution or dissolution using a solvent.

The liquid source material is vaporized to a source gas while being sprayed into a heated vaporization chamber along with, e.g., a carrier gas flow, through a spray nozzle provided at the vaporizer. The source gas is supplied to the film forming chamber and reacts with another gas therein, so that a predetermined film is formed on a substrate (see e.g., Japanese Patent Laid-open Publication Nos. 2000-58528, 2005-109349, H3-126872, H6-310444 and H7-094426).

A flow rate of the source gas required in the vaporizer varies depending on types of liquid source materials or types of processing using the source gas, such as film formation and the like. Accordingly, conventionally, there is provided a vaporizer in which a discharge port of the spray nozzle, a size of a carrier gas flow path or the like are designed so as to maximize vaporization efficiency of the liquid source material in accordance with a flow rate of the source gas required by the vaporizer. Therefore, in the conventional case, the change in types of processing using the source gas demands replacement of the entire vaporizer with another vaporizer capable of coping with a flow rate of the source gas required for the processing.

However, if the entire vaporizer is replaced whenever the types of processing are changed, there arises a need to design a vaporizer which can cope with a flow rate of the source gas required for the processing and examine reliability of the vaporizer. As a result, manufacturing throughput decreases, and a development cost of a vaporizer increases. Further, since, for example, it is required to manage various vaporizers in accordance with various flow rates of the source gas, the management of the vaporizers becomes complicated.

Moreover, in the case of the above-described vaporizer which generates a source gas by vaporizing a liquid source material ejected from a spray nozzle, it is required to eject small-sized liquid droplets obtained by minimizing the discharge port of the spray nozzle in view of vaporization efficiency.

If the discharge port of the spray nozzle is minimized, in order to increase a flow rate of the source gas, it is considered to increase, e.g., a flow rate of a carrier gas. Since, however, the increase in a flow rate of the carrier gas is limited, it is unavoidable to increase the discharge port of the spray nozzle in order to further increase a flow rate of the source gas. This results in an increase in a size of the liquid droplets of the liquid source material ejected from the spray nozzle, so that the vaporization efficiency is lowered. As such, in the conventional vaporizer, it is considerably difficult to increase a flow rate of the source gas while maintaining vaporization efficiency.

SUMMARY OF THE INVENTION

Therefore, in view of the above-described problems, the present invention provides a vaporizer having a structure that can be easily changed in accordance with various flow rates of a source gas in a range from low to high levels without decreasing vaporization efficiency.

In accordance with a first embodiment of the invention, there is provided a vaporizer including a plurality of vaporization modules for generating a source gas by vaporizing a liquid source material, the vaporizer being formed by connecting the vaporization modules wherein each of the vaporization modules includes: a discharge opening for discharging the liquid source material; a vaporization chamber for generating the source gas by vaporizing the liquid source material discharged through the discharge opening; a liquid material flow path extended to penetrate joint surfaces adapted to be connected to at least other vaporization modules; and a discharge path communicating with a portion of the liquid material flow path, for directing the liquid material flowing in the liquid material flow path to the discharge opening, wherein the vaporization modules are connected to one another at the joint surfaces so that liquid material flow paths of the vaporization modules communicate with each other.

In accordance with the present invention, the vaporization modules are connected at the joint surfaces to one another, so that the liquid material flow paths of the vaporization modules communicate with one another and serve as a common liquid material chamber. Therefore, once the liquid source material is supplied at a predetermined pressure to a liquid material flow path of at least one of the vaporization modules, the liquid source material is also supplied to the other vaporization modules via the liquid material flow paths of the other vaporization modules and filled therein. Accordingly, the liquid source material can be simultaneously discharged through the discharge openings via the discharge flow paths of the vaporization modules and vaporized in the vaporization chambers of the vaporization modules. As a result, the flow rate of the source gas generated in the entire vaporizer can be controlled simply by increasing or decreasing the number of vaporization modules connected to one another.

Thus, the structure of the vaporizer can be easily changed in accordance with various flow rates of the source gas in a range from low to high levels. Further, there is no need to change the size of the discharge openings of the spray nozzles of the vaporization modules and the like in accordance with the flow rate of the source gas, so that there is no need to redesign the vaporization modules whenever the processing conditions are changed. As a consequence, it is possible to obtain with ease a vaporizer capable of increasing a flow rate of a source gas while maintaining vaporization efficiency. For that reason, deterioration of a manufacturing throughput can be suppressed, and a development cost for a new vaporizer is not incurred. Moreover, since the vaporization modules to be managed are of the same type, the management of the vaporizer becomes simple. Besides, by connecting a plurality of the block-shaped vaporization modules to one another at the joint surfaces, the vaporization modules can be integrated and, hence, the entire vaporizer can be made extremely compact.

Each of the vaporization modules may have a rectangular cross section and side surfaces serving as joint surfaces connected to other vaporization modules, and the liquid material flow path of each of the vaporization modules is extended to penetrate a pair of parallel joint surfaces. The liquid material flow paths of the vaporization modules can communicate linearly with each other by connecting the vaporization modules in a single row. An upstream opening of the liquid material flow path of the first vaporization module is connected to a liquid material supply source and a downstream opening of the liquid material flow path of the last vaporization module is blocked. Accordingly, the liquid material flow paths of the vaporization modules communicate with one another to serve as a common liquid material chamber. Therefore, once the liquid source material is supplied at a predetermined pressure to the liquid material flow path of the first vaporization module, the liquid source material is also supplied to the last vaporization module via the liquid material flow paths of the vaporization modules and filled therein. As a result, the liquid source material can be simultaneously discharged through the discharge openings via the discharge flow paths of the vaporization modules.

The vaporization modules may be connected in a plurality of rows, and liquid material flow paths of vaporization modules in the respective rows can communicate linearly with each other, wherein first vaporization modules in the respective rows are connected to a flow path block having a flow path for dividing a liquid source material from a liquid material supply source in accordance with a number of rows, wherein the liquid source material is supplied to upstream openings of liquid material flow paths of the first vaporization modules in the respective rows via the flow path of the flow path block, and downstream openings of liquid material flow paths of last vaporization modules in the respective rows are blocked. Accordingly, the liquid material flow paths of the vaporization modules communicate with one another, to serve as a common liquid material chamber. Therefore, once the liquid source material is supplied at a predetermined pressure to the liquid material flow paths of the first vaporization modules in the respective rows via the flow path block, the liquid source material is also supplied to the last vaporization modules in the respective rows via the liquid material flow paths of the vaporization modules and filled therein. As a result, the liquid source material can be simultaneously discharged through the discharge openings via the discharge flow paths of the vaporization modules.

Each of the vaporization modules may have, e.g., a rectangular cross section and side surfaces serving as joint surfaces connected to other vaporization modules, and the liquid material flow path of each of the vaporization modules is extended to penetrate at least two adjacent joint surfaces. The liquid material flow paths of the vaporization modules may be extended to penetrate all the joint surfaces for example and communicate in a row and a column direction by connecting the vaporization modules in a row direction as well as in a column direction perpendicular thereto.

In this case, by connecting the liquid material supply source to one of openings of the liquid material flow paths which open on a joint surface disconnected from another vaporization module, and blocking other openings of the liquid material flow paths, it is possible to make the liquid material flow paths of the vaporization modules communicate with one another to serve as a common liquid material chamber. In that case, the liquid material flow paths are connected in the row direction as well as in the column direction. Thus, once the liquid source material is supplied at a predetermined pressure to a liquid material flow path that opens at the joint surface of any vaporization module, the liquid source material is also supplied to the other vaporization modules via the liquid material flow paths communicating with one another and filled therein. Hence, the liquid source material can be simultaneously discharged through the discharge openings via the discharge flow paths of the vaporization modules. As a result, the flow of the liquid source material in the vaporization modules can be facilitated, and the flow path block for dividing the liquid source material from the liquid material supply source becomes unnecessary.

Further, by connecting the vaporization modules in the row and the column direction in a matrix pattern, a plurality of the vaporization modules can be integrated more compactly. Further, the vaporization modules may be connected in the row and the column direction in a matrix pattern, and the liquid material flow paths of the vaporization modules may be extended to penetrate the joint surfaces connected to other vaporization modules. Hence, the liquid material flow paths do not open at the side surfaces that are not connected to other vaporization modules among the side surfaces of the vaporization modules, and there is no need to block the liquid material flow paths.

In accordance with a second embodiment of the invention, there is provided a vaporizer including a plurality of block-shaped vaporization modules for generating a source gas by vaporizing a liquid source material, the vaporizer being formed by connecting the vaporization modules wherein each of the vaporization modules includes: a liquid material flow path extended to penetrate joint surfaces adapted to be connected to at least other vaporization modules and a source gas flow path extended to penetrate the joint surfaces; a vaporization chamber provided between the liquid material flow path and the source gas flow path, the vaporization chamber being elongated longitudinally in a direction perpendicular to the flow paths; a discharge opening provided at one end of the vaporization chamber, for discharging the liquid material flowing in the liquid material flow path toward the vaporization chamber; and a source gas outlet provided at the other end of the vaporization chamber, for discharging the source gas generated by vaporizing the liquid source material discharged through the discharge opening to the source gas flow path, wherein the vaporization modules are connected to one another at the joint surfaces so that the liquid material flow paths of the vaporization modules communicate with each other.

In accordance with the present invention, the vaporization modules are connected at the joint surfaces to one another, so that the liquid material flow paths of the vaporization modules communicate with one another and serve as a common liquid material chamber and, also, the source gas flow paths of the vaporization modules communicate with one another. Therefore, once the liquid source material is supplied at a predetermined pressure to a liquid material flow path of at least one of the vaporization modules, the liquid source material is also supplied to the other vaporization modules via the liquid material flow paths of the other vaporization modules and filled therein. Accordingly, the liquid source material can be simultaneously discharged through the discharge openings via the discharge flow paths of the vaporization modules. Further, the source gas generated in the vaporization chambers of the vaporization modules can be simultaneously discharged to the outside via the source gas flow paths. As a result, the flow rate of the source gas generated in the entire vaporizer can be controlled simply by increasing or decreasing the number of vaporization modules connected to one another.

Each of the vaporization modules may include a carrier gas flow path where a carrier gas injected toward the vaporization chamber flows together with the liquid source material discharged through the discharge opening, and wherein the carrier gas flow paths of the vaporization modules are extended to penetrate the joint surfaces through which the liquid material flow paths penetrate, and the carrier gas flow paths as well as the liquid material flow paths of the vaporization modules communicate with each other by connecting the vaporization modules to one another at the joint surfaces. Therefore, once the carrier gas is supplied to a carrier gas flow path of one of the vaporization modules, the carrier gas can be supplied to the other vaporization modules via the carrier gas flow paths communicating with one another. As a consequence, the carrier gas can be simultaneously injected toward the vaporization chambers in the vaporization modules together with the liquid source material.

Each of the vaporization modules may include a carrier gas injection opening for injecting the carrier gas from the carrier gas flow path, and the discharge opening is disposed within the carrier gas injection opening having a diameter larger than a diameter of the discharge opening. Accordingly, the carrier gas can be injected around the discharge opening, and the liquid droplets of the liquid source material discharged through the discharge opening can reliably travel toward the vaporization chamber.

Preferably, the diameter of the carrier gas injection opening is smaller than that of the carrier gas flow path. For example, when the diameter of the carrier gas injection opening is smaller than or equal to about 1/10 of the diameter of the carrier gas flow path, the carrier gas can flow without deteriorating the conductance of the carrier gas flow path.

The carrier gas flow path may communicate with the discharge flow path, and the carrier gas is mixed with the liquid source material in the discharge flow path to be discharged through the discharge opening toward the vaporization chamber. The liquid source material which is mixed with the carrier gas may flow in the liquid material flow path of each of the vaporization modules. In this way, the liquid source material and the carrier gas may be mixed while being injected to the vaporization chamber, or may be mixed before being injected to the vaporization chamber.

In each of the vaporization modules, a heating unit for heating the vaporization chamber may be provided in the sidewall of the vaporization chamber. In each of the vaporization modules, a heating unit for heating the vaporization chamber may be provided in the vaporization chamber. Due to the presence of the heating units provided the sidewall of the vaporization chamber and the vaporization chamber, the vaporization efficiency of the liquid source material in the vaporization chamber can be further increased. Accordingly, the length between both ends of the vaporization chamber can be further reduced, and the size of the longitudinal direction along the side surfaces of the vaporization modules can be further reduced. As a result, the entire vaporizer can be formed compactly.

In accordance with a third embodiment of the invention, there is provided a vaporization module in a vaporizer formed by connecting a plurality of block-shaped vaporization modules for generating a source gas by vaporizing a liquid source material, the vaporization module including: a discharge opening for discharging the liquid source material; a vaporization chamber for generating the source gas by vaporizing the liquid source material discharged through the discharge opening; a liquid material flow path extended to penetrate joint surfaces adapted to be connected to at least other vaporization modules; and a discharge path communicating with a portion of the liquid material flow path, for discharging the liquid material flowing in the liquid material flow path to the discharge opening. With such configuration, the vaporizer can be formed by connecting a plurality of the vaporization modules having the same configuration and, also, the flow rate of the source gas generated in the entire vaporizer can be controlled simply by increasing or decreasing the number of vaporization modules connected to one another.

Each of the vaporization modules may have a rectangular cross section and side surfaces serving as joint surfaces connected to other vaporization modules, and the liquid material flow paths of each of the vaporization modules may be extended to penetrate a pair of parallel joint surfaces. A vaporizer can be formed by connecting a plurality of such vaporization modules having the same configuration in a single row or in a plurality of rows. Each of the vaporization modules may have a rectangular cross section and side surfaces serving as the joint surfaces adapted to connected to other vaporization modules, and the liquid material flow path of each of the vaporization modules is extended to penetrate at least two adjacent joint surfaces. A vaporizer can be formed by connecting a plurality of such vaporization modules having the same configuration in a row and a column direction.

The vaporization module may further include a source gas flow path in which the source gas generated in the vaporization chamber flows, wherein the liquid source gas flow path is extended to penetrate the joint surfaces through which the liquid material flow path penetrates. Accordingly, the source gas generated in the vaporization chambers of the vaporization modules can be simultaneously discharged to the outside of the vaporizer via the source gas flow paths.

The vaporization chamber may be provided between the liquid material flow path and the source gas flow path, the vaporization chamber being elongated longitudinally in a direction perpendicular to the flow paths, wherein the discharge opening is disposed at one end of the vaporization chamber, and a source gas outlet for discharging the source gas generated in the vaporization chamber to the source gas flow path is formed at the other end of the vaporization chamber. Thus, the vaporization efficiency of the liquid source material injected to the vaporization chamber can be controlled by changing the length between both ends of the vaporization chamber.

The vaporization module may further include a carrier gas flow path where a carrier gas injected toward the vaporization camber flows together with the liquid source material discharged through the discharge opening, wherein the carrier gas flow path is extended to penetrate joint surfaces same as joint surfaces through which the liquid material flow path penetrates.

In accordance with a fourth embodiment of the invention, there is provided a film forming apparatus including: a vaporizer for generating a source gas by vaporizing a liquid source material introduced via a liquid material flow path; and a film forming chamber for forming a film on a target substrate by using the source gas introduced from the vaporizer, wherein the vaporizer is formed by connecting a plurality of block-shaped vaporization modules, and each of the vaporization modules includes: a liquid material flow path extended to penetrate joint surfaces adapted to be connected to at least other vaporization modules; a source gas flow path extended to penetrate the joint surfaces; a vaporization chamber provided between the liquid material flow path and the source gas flow path; a discharging opening provided at one end side of the vaporization chamber, for discharging the liquid material source flowing in the liquid material flow path toward the vaporization chamber; and a source gas outlet for discharging the source gas generated by vaporizing the liquid source material discharged through the discharge opening to the source gas flow path, wherein the vaporization modules are connected to one another at the joint surfaces so that the liquid material flow paths communicate with each other to form the source gas flow path of the vaporizer.

With such configuration, even if the conditions of film forming process of the film forming apparatus are changed, the structure of the vaporizer can be changed in accordance with a flow rate of the source gas required for the film forming process simply by increasing and decreasing the number of vaporization modules forming the vaporizer.

EFFECTS OF THE INVENTION

In accordance with the present invention, there can be provided a vaporizer having a structure that can be easily changed in accordance with various flow rates of a source gas in a range from low to high levels simply by increasing and decreasing the number of vaporization modules to be connected to one another.

DETAILED DESCRIPTION OF THE EMBODIMENT

Figure 1:
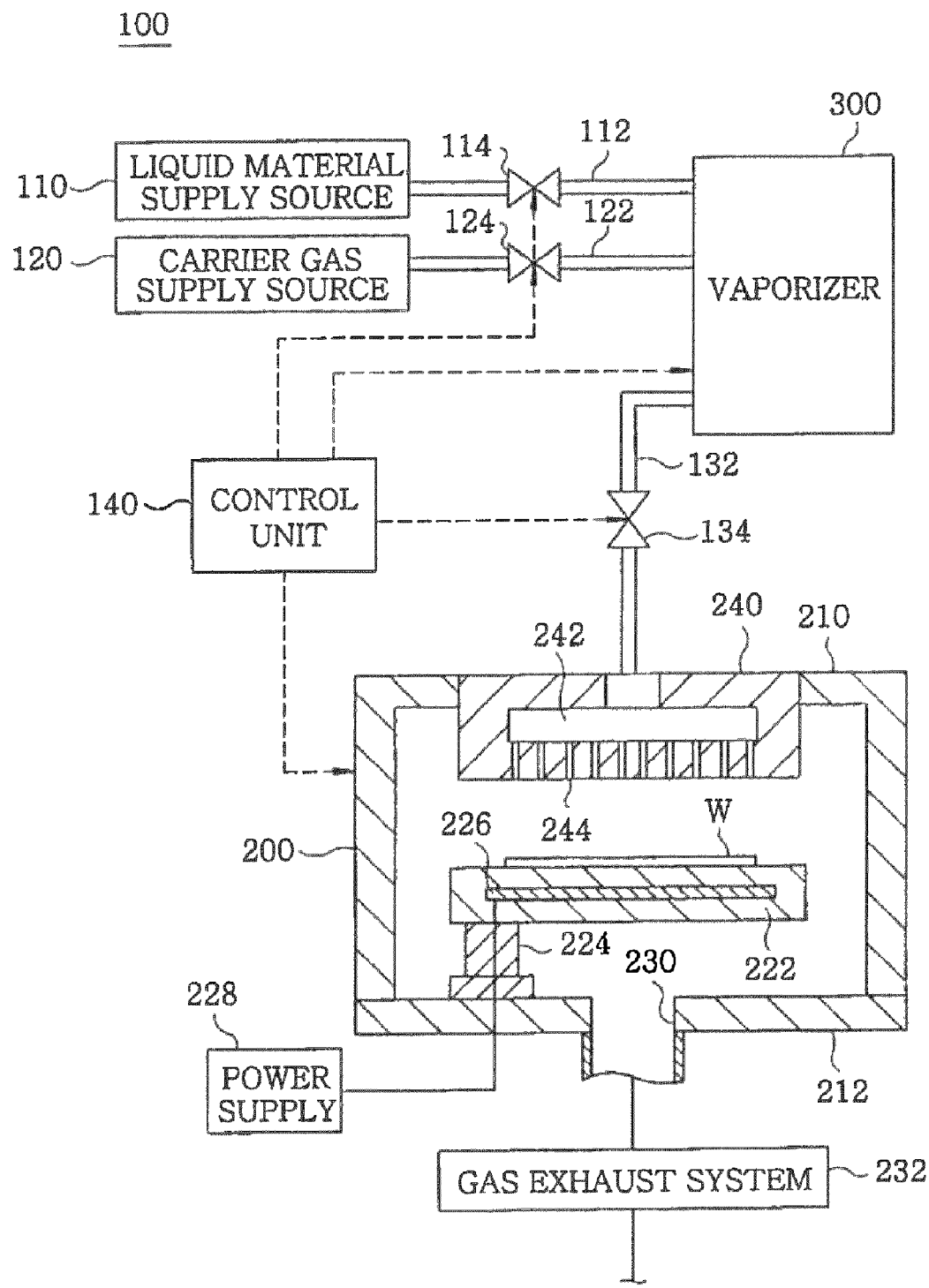
FIG. 1 describes a schematic configuration example of a film forming apparatus in accordance with a first embodiment of the present invention.

Hereinafter, the preferred embodiments of the present invention will be described in detail with reference to the accompanying drawings. Further, in this specification and the accompanying drawings, like reference numerals will be assigned to like parts having substantially same functions, and redundant description thereof will be omitted.

Film Forming Apparatus of First Embodiment

First of all, a film forming apparatus to which a vaporizer in accordance with a first embodiment of the present invention is applied will be described with reference to the drawing. FIG. 1 describes a schematic configuration example of a film forming apparatus 100 in accordance with the first embodiment. The film forming apparatus 100 forms, e.g., a Hf (hafnium) oxide film, on a target substrate, e.g., a semiconductor wafer (hereinafter, simply referred to as a "wafer") W by a CVD method, and includes a liquid material supply source 110 for supplying a liquid source material containing Hf, a carrier gas supply source 120 for supplying a carrier gas, a vaporizer 300 for generating a source gas by vaporizing the liquid material supplied from the liquid material supply source 110, a film forming chamber 200 for forming an Hf oxide film on the wafer W by using the source gas generated by the vaporizer 300, and a control unit 140 for controlling each unit of the film forming apparatus 100. Further, as for a carrier gas, it is preferable to use an inert gas, e.g., $N_2$, He, Ar or the like.

Moreover, the liquid material supply source 110 and the vaporizer 300 are connected by a liquid material supply line 112; the carrier gas supply source 120 and the vaporizer 300 are connected by a carrier gas supply line 122; and the vaporizer 300 and the film forming chamber 200 are connected by a source gas supply line 132. Furthermore, the liquid material supply line 112 is provided with a liquid material flow rate control valve 114; the carrier gas supply line 122 is provided with a carrier gas flow rate control valve 124; the source gas supply line 132 is provided with a source gas flow rate control valve 134. The respective opening degrees of the liquid material flow rate control valve 114, the carrier gas flow rate control valve 124 and the source gas flow rate control valve 134 are controlled by control signals from the control unit 140. The control unit 140 preferably outputs control signals in accordance with the flow rates of the liquid material flowing in the liquid material supply line 112, the carrier gas flowing in the carrier gas supply line 122, and the source gas flowing in the source gas supply line 132.

The film forming chamber 200 is formed in a substantially cylindrical shape, and has, in its inner space surrounded by a bottom wall 212 and a ceiling wall 210 made of metal (e.g., aluminum or stainless steel), a susceptor 222 on which the wafer W is horizontally mounted. The susceptor 222 is supported by a plurality of columnar supporting members 224

(only one being shown). Further, a heater 226 is buried in the susceptor 222, so that a temperature of the wafer W mounted on the susceptor 222 can be adjusted by controlling power supplied from a power supply 228 to the heater 226.

A gas exhaust port 230 is formed in the bottom surface 212 of the film forming apparatus 200, and a gas exhaust system 232 is connected to the gas exhaust port 230. Further, the inner space of the film forming chamber 200 can be depressurized to a predetermined vacuum level by the gas exhaust system 232.

A shower head 240 is attached to the ceiling wall 210 of the film forming chamber 200. The source gas supply line 132 is connected to the shower head 240, so that the source gas generated by vaporization in the vaporizer 300 is introduced into the shower head 240 via the source gas supply line 132. The shower head 240 has an inner space 242 and a plurality of gas injection openings 244 formed in a surface facing the susceptor 222. The source gas introduced into the inner space 242 of the shower head 240 via the source gas supply line 132 is injected through the gas injection openings 244 toward the wafer W on the susceptor 222.

In the film forming apparatus 100 of this embodiment, the liquid material supply source 110 stores therein a liquid source material, e.g., Hf-based organic metal compound. This liquid source material is fed to the vaporizer 300 via the liquid material supply line 112. As for the HF-based organic metal compound, there is used, e.g., tetra-tertiary-butoxy-hafnium [Hf(Ot-Bu)$_4$], tetra-diethylamino-hafnium [Hf(NEt$_2$)$_4$], tetrakis-methoxy-methyl-propoxy-hafnium [Hf(MMP)$_4$], tetra-dimethylamino-hafnium [Hf(NMe$_2$)$_4$], tetra-methylethylamino-hafnium [Hf(NMeEt)$_4$], tetrakis-triethyl-siloxy-hafnium [Hf(OSiEt$_3$)$_4$] or the like.

In addition, other organic metal compounds than Hf-based organic metal compound may be used as the liquid material. For example, it is possible to use pentaethoxy-tantalum [Ta (O-Et)], tetra-tertiary-butoxy-zirconium [Zr(Ot-Bu)$_4$], tetra-ethoxy-silicon [Si(OEt)$_4$], tetra-dimethylamino-silicon [Si (NMe$_2$)$_4$] tetrakis-methoxy-methyl-propoxy-zirconium [Zr (MMP)$_4$], dis-ethyl-cyclopentadiene-ruthenium [Ru(Et Cp)$_2$], tertiary-amyl-imide-tridimethylamide tantalum [Ta (Nt-Am)(NMe$_2$)$_4$], tris-dimethylamino-silane [HSi (NMe$_2$)$_3$], or the like.

The aforementioned organic metal compounds exist in a liquid or a solid state at a room temperature. Thus, in order to use them as a liquid material, they are generally diluted with or dissolved in an organic solvent such as octane or the like.

In the film forming apparatus 100 configured as described above, the source gas from the vaporizer 300 is supplied in the following manner. When the liquid material from the liquid material supply source 110 and the carrier gas from the carrier gas supply source 120 are supplied to the vaporizer 300 via the liquid material supply line 112 and the carrier gas supply line 122, respectively, the liquid material is sprayed into a vaporization chamber provided in the vaporizer 300 together with the carrier gas. Accordingly, the liquid material is vaporized, thus generating a source gas. The source gas generated in the vaporizer 300 is supplied to the film forming chamber 200 via the source gas supply line 132, and desired processing is performed on the wafer W in the film forming chamber 200.

In general, a flow rate of the source gas required in the vaporizer 300 varies in accordance with conditions (e.g., a thickness of a formed film, film types, a required film forming rate and the like) of processing performed on the wafer W in the film forming chamber 200. For that reason, in the conventional case, the change in the required flow rate of the source gas requires the replacement of the entire vaporizer with another vaporizer capable of coping with the change in the flow rate of the source gas.

However, if the entire vaporizer is replaced whenever the types of processing are changed, there arises a need to design a vaporizer which can cope with a flow rate of the source gas required for the processing and examine reliability of the vaporizer. As a result, manufacturing throughput decreases, and a development cost of a vaporizer increases. Further, since it is required to manage various vaporizers in accordance with various flow rates of the source gas, the management process becomes complicated.

To that end, in the present invention, a vaporizer is formed by connecting a plurality of block-shaped vaporization modules for generating a source gas by vaporizing a liquid material. Hence, the flow rate of the source gas generated in the vaporizer can be controlled simply by increasing and decreasing the number of vaporization modules to be connected to one another. As a consequence, the configuration of the vaporizer can be easily changed in accordance with various flow rates of the source gas ranging from low to high levels.

Configuration Example of Vaporizer of First Embodiment

Figure 2:
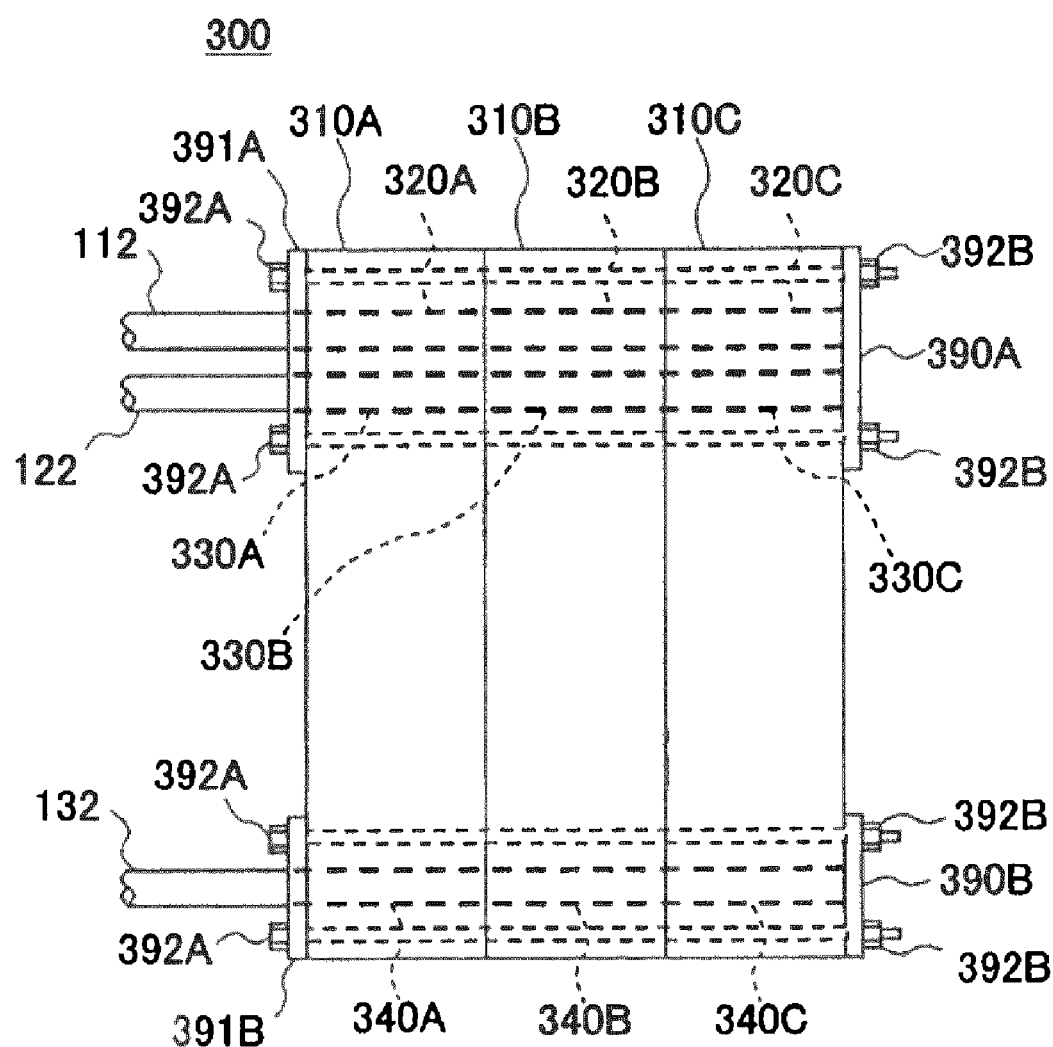
FIG. 2 provides a side view showing a schematic configuration example of a vaporizer in accordance with the first embodiment of the present invention.
Figure 3:
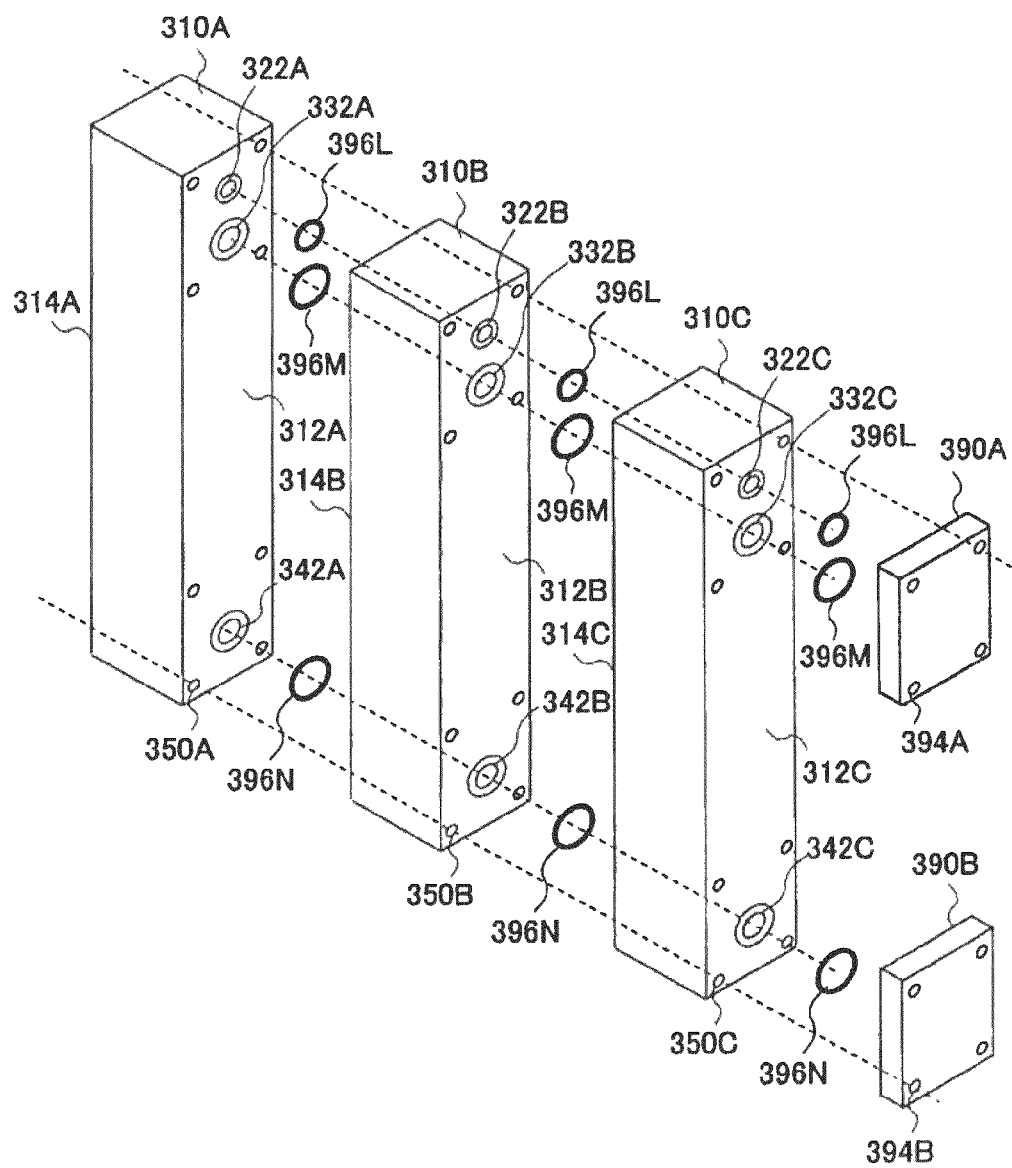
FIG. 3 offers an assembly perspective view of the vaporizer in accordance with the first embodiment of the present invention.

Hereinafter, a detailed configuration example in which the vaporizer of the present invention is applied to the vaporizer 300 of the film forming apparatus 100 in accordance with the first embodiment will be described with reference to the drawings. FIG. 2 presents a side view schematically showing the configuration example of the vaporizer 300 in accordance with the first embodiment, and FIG. 3 represents an exploded perspective view of the vaporizer 300. As shown in FIGS. 2 and 3, the vaporizer 300 includes a plurality of block-shaped vaporization modules 310A to 310C for generating a source gas by vaporizing a liquid material, an end plate 390A for blocking end portions of liquid material flow paths and carrier gas flow paths of the vaporization modules which will be described later, and an end plate 390B for blocking end portions of source gas flow paths of the vaporization modules which will be described later.

The vaporization modules 310A to 310C have the same configuration, and each is formed in a vertically elongated block shape having a rectangular (square in this embodiment) cross section. Formed respectively in the vaporization modules 310A to 310C are liquid material flow paths 320A to 320C where a liquid material flows, carrier gas flow paths 330A to 330C where a carrier gas flows, and source gas flow paths 340A to 340C where a source gas flows.

The vaporization modules 310A to 310C are connected to one another in a single row. As illustrated in FIGS. 2 and 3, the vaporization modules 310A to 310C have a plurality of holes through which bolts 392A pass, and are clamped to one another between a flange portion 391A of the liquid material supply line 112 and the carrier gas supply line 122 and the end plate 390A by bolts 392A and nuts 392B and between a flange portion 391B of the source gas supply line 132 and the end plate 390B by bolts 392A and nuts 392B.

Although FIGS. 2 and 3 show the example in which the flange portion 391A of the carrier gas supply line 122 and the liquid material supply line 112 serves as a common flange portion to both lines and is clamped by the bolts 392A and the nuts 392B, it is not limited thereto. For example, the flange portion 391A may be formed independently for each of the liquid source supply line 112 and the carrier gas supply line 122. Moreover, the number of the bolts 392A and the nuts 392B is not limited to one shown in FIGS. 2 and 3. For example, each flange portion of the liquid material supply line 112 and the carrier gas supply line 112 may be clamped by four bolts 392A and four nuts 392B.

Accordingly, each of the vaporization modules 310A to 310C has a pair of parallel side surfaces serving as joint surfaces, and is connected at its joint surface to another vaporization module. In other words, the vaporization module 310A is closely adhered at its side surface 312A to a side surface 314B of the vaporization module 310B adjacent thereto; the vaporization module 310B is closely adhered at its side surface 312B to a side surface 314C of the vaporization module 310C adjacent thereto; the vaporization module 310C is closely adhered at its side surface 312C to the end plates 390A and 390B.

Further, in the vaporization modules 310A to 310C, the liquid material flow paths 320A to 320C, the carrier gas flow paths 330A to 330C, and the source gas flow paths 340A to 340C are formed so as to penetrate the pairs of parallel side surfaces 312A and 314A, 312B and 314B, and 312C and 314C serving as joint surfaces. Accordingly, openings 322A to 322C of the liquid material flow paths 320A to 320C, openings 332A to 332C of the carrier gas flow paths 330A to 330C, and openings 342A to 342C of the source gas flow paths 340A to 340C are formed in the side surfaces 312A to 312C. In the same manner, openings are formed in the side surfaces 314A to 314C disposed in parallel with the side surfaces 312A to 312C.

In addition, through holes 350A to 350C are formed at, e.g., eight locations of the vaporization modules 310A to 310C, respectively. Moreover, through holes 394A and 394B are formed at four locations of each of the end plates 390A to 390B which correspond to the locations of the through holes 350A to 350C in the respective vaporization modules 310A to 310C. By inserting, for example, the bolts 392A through the through holes 350A to 350C, 394A and 394B and tightening the nuts 392B, the vaporization modules 310A to 310C and the end plates 390A and 390B can be closely coupled at their respective side surfaces to one another.

In the vaporizer 300 configured as described above, the vaporization modules 310A to 310C are connected to one another in a single row, so that the liquid material flow paths 320A to 320C, the carrier gas flow paths 330A to 330C, and the source gas flow paths 340A to 340C of the respective vaporization modules 310A to 310C communicate linearly through the first vaporization module 310A to the last vaporization module 310C. The liquid material supply line 112, the carrier gas supply line 122 and the source gas supply line 132 are respectively connected to the upstream openings of the liquid material flow path 320A, the carrier gas flow path 330A and the source gas flow path 340A of the first vaporization module 310A. Therefore, the liquid material and the carrier gas can be supplied through the first vaporization modules 310A to the last vaporization module 310C. Further, the source gas can be supplied from the vaporization modules 310A to 310C to the source gas supply line 132.

The end plates 390A and 390B block the respective downstream openings 322C, 332C and 342C of the liquid material flow path 320C, the carrier gas flow path 330C and the source gas flow path 340C of the last vaporization module 310C. Due to the presence of the end plates 390A and 390B, the liquid material and the carrier gas can be supplied to the respective vaporization modules 310A to 310C without being wasted, and the source gas generated in the vaporization modules 310A to 310C can be sent to the source gas supply line 132.

In the first embodiment, the end plate 390A is closely attached to an upper portion of the side surface 312C of the vaporization module 310C, to block the opening 322C of the liquid material flow path 320C and the opening 332C of the carrier gas flow path 330C. Further, the end plate 390B is closely attached to a lower portion of the side surface 312C of the vaporization module 310C to block the opening 342C of the source gas flow path 340C. A single end plate for blocking all of the openings 322C, 332C and 342C may be used instead of the two end plates 390A and 390B. In addition, an end plate may be provided independently for each of the liquid material flow path 320C, the carrier gas flow path 330C, and the source gas flow path 340C.

Moreover, as the last vaporization module 310C, there may be provided another vaporization module in which the liquid material flow path 320C, the carrier gas flow path 330C and the source gas flow path 340C penetrate the side surface (joint surface) 314C connected to the adjacent vaporization module without penetrating the side surface (joint surface) 312C that is connected to no vaporization module. In that case, the end portions of the respective flow paths do not open, so that the end plates become unnecessary.

When the vaporization modules 310A to 310C are closely adhered to one another, it is preferable to dispose three seal members, e.g., O-rings 396L, 396M and 396N, between the contact side surfaces thereof. The O-rings 396L, 396M and 396N are disposed to surround the openings 322A to 322C of the liquid material flow paths 320A to 320C, openings 332A to 332C of the carrier gas flow paths 330A to 330C, and openings 342A to 342C of the source gas flow paths 340A to 340C. Accordingly, the liquid source material, the carrier gas and the source gas can be prevented from leaking from the contact surfaces of the respective vaporization modules 310A to 310C.

Configuration Examples of Vaporization Modules of First Embodiment

Hereinafter, configuration examples of the vaporization modules 310A to 310C in accordance with the first embodiment of the present invention will be described with reference to the drawings. Since the vaporization modules 310A to 310C have the same configuration as described above, the configuration example of a vaporization module 310 will be representatively explained.

Figure 4:
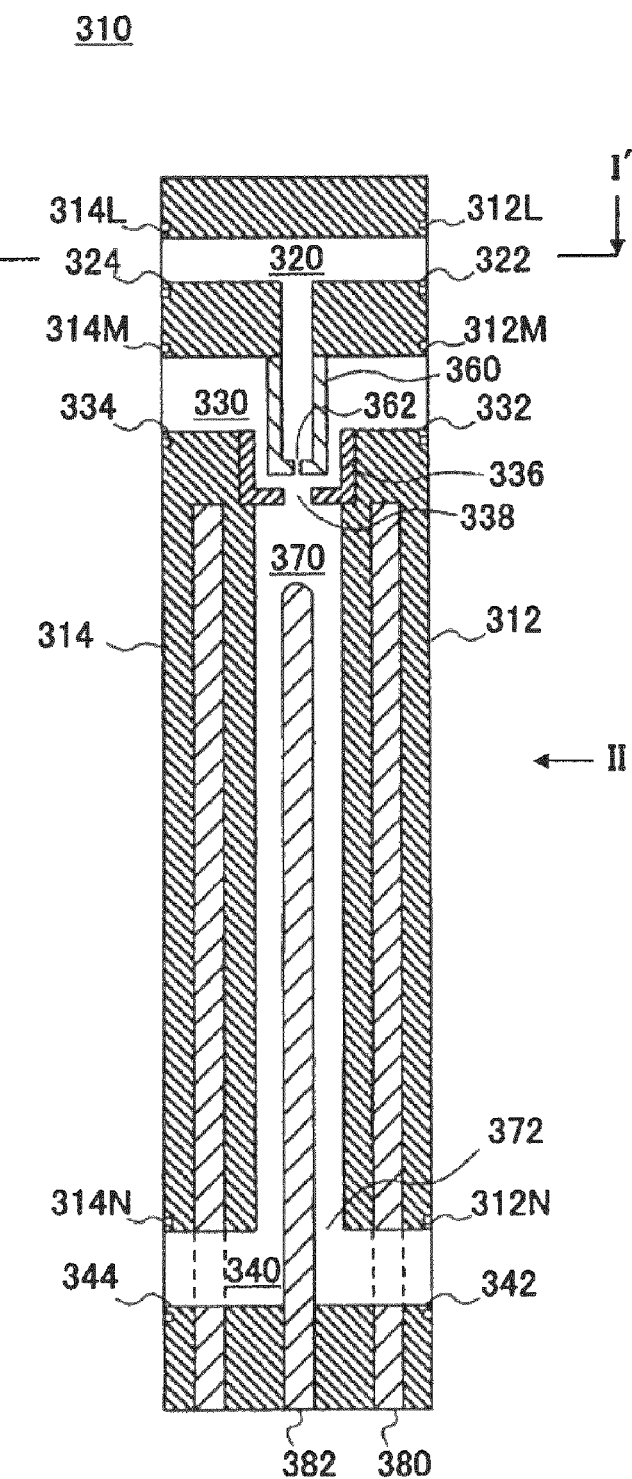
FIG. 4 shows a schematic configuration example of a vaporization module in accordance with the first embodiment of the present invention.
Figure 5:
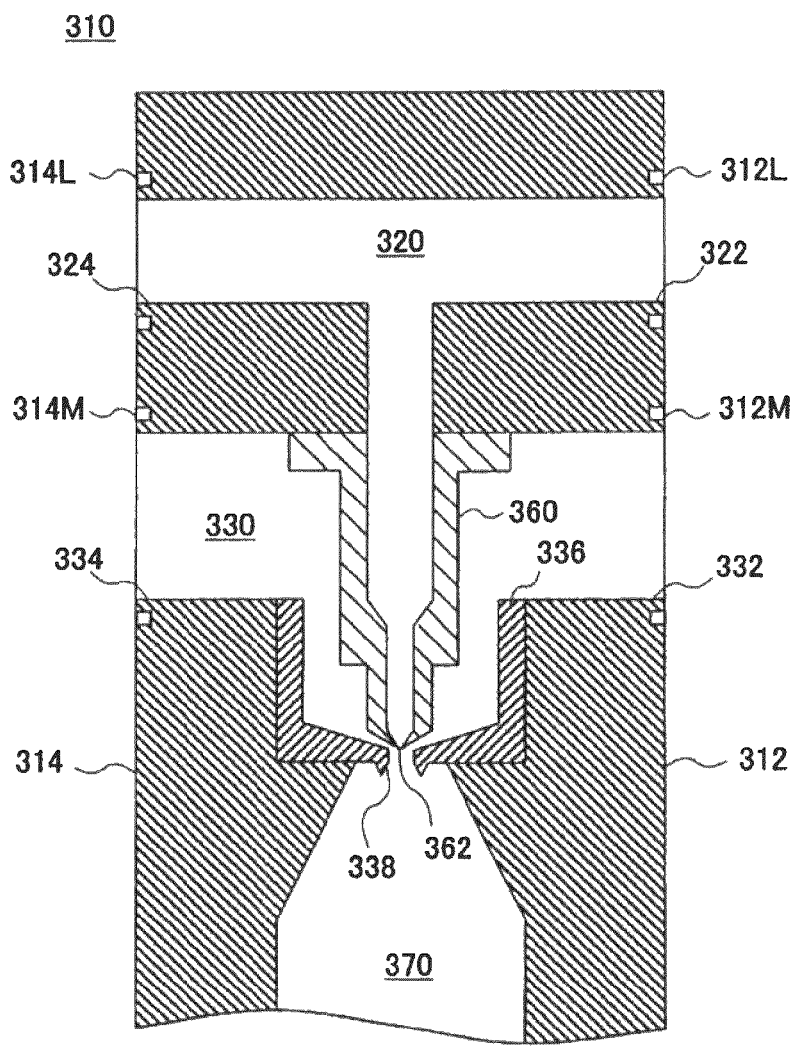
FIG. 5 offers a vertical cross sectional view illustrating a detailed configuration example of a spray nozzle provided at the vaporization module of FIG. 4.
Figure 6:
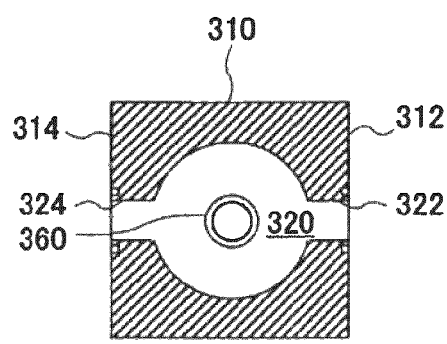
FIG. 6 presents an I-I' cross sectional view of the vaporization module having an I-shaped flow path of FIG. 4.

FIG. 4 is a vertical cross sectional view schematically showing the configuration example of the vaporization module 310 in accordance with the first embodiment; FIG. 5 offers a vertical cross sectional view illustrating a detailed configuration example of a spray nozzle 360 provided in the vaporization module 310 of FIG. 4; FIG. 6 depicts an I-I' cross section of the vaporization module 310 when seen from the arrow direction in FIG. 4; and FIG. 7 describes a side view of the vaporization module 310 when seen from the arrow II direction in FIG. 4.

As set forth above, the vaporization module 310 is formed in a block shape having a rectangular (square in this embodiment) cross section, and thus has two pairs of parallel side surfaces. In the vaporization module 310, a pair of side surfaces 312 and 314 among four side surfaces can serve as joint surfaces where the vaporization module 310 is closely connected to other vaporization modules to thereby form the vaporizer 300.

As shown in FIGS. 4 and 6, in the vaporization module 310, a liquid material flow path 320, a carrier gas flow path 330 and a source gas flow path 340 are formed so as to penetrate the inside thereof in the same direction (horizontal direction in FIG. 4). The liquid material flow path 320, the carrier gas flow path 330 and the source gas flow path 340 penetrate the pair of side surfaces 312 and 314 serving as joint surfaces.

The penetration of the liquid material flow path 320 through the side surfaces 312 and 314 results in formation of openings 322 and 324. The penetration of the carrier gas flow path 330 through the side surface 312 and 314 results in formation of openings 332 and 334. The penetration of the source gas flow path 340 through the side surfaces 312 and 314 results in formation of openings 342 and 344.

A vaporization chamber 370 having an inner space elongated in a vertical direction perpendicular to the direction of the flow paths 320 and 340 is provided between the liquid material flow path 320 and the source gas flow path 340. Disposed at one end side (upper side in FIG. 4) of the vaporization chamber 370 is a spray nozzle 360 forming a discharge opening (injection opening) 362 for atomizing and discharging a liquid source material from the liquid material flow path 320. In the inner space of the vaporization chamber 370, a source gas is generated by vaporizing the liquid source material discharged from a discharge opening 362.

A sidewall heating unit 380 for heating the inner space of the vaporization chamber 370 is embedded in the side wall defining the inner space in order to increase the vaporization efficiency of the liquid source material. In the vaporization module 310 of FIG. 4, an internal heating unit 382 is vertically extended in the inner space of the vaporization chamber 370 in order to further increase the vaporization efficiency. Besides, a source gas outlet 372 for discharging the source gas generated in the vaporization chamber 370 to the source gas flow path 340 is formed at the other end side of the vaporization chamber 370.

FIG. 5 shows a detailed configuration example of the vicinity of the spray nozzle 360. An opening is formed downward in the middle of the liquid material flow path 320 (here, the center of the module), and communicates with a through hole in the spray nozzle 360 so as to form a discharge flow path for discharging the liquid material flowing in the liquid material flow path 320 through the discharge opening 362 of the spray nozzle 360.

As shown in, e.g., FIG. 5, the spray nozzle 360 has a thin tip, and the discharge opening (nozzle opening) 362 formed at the tip end thereof is disposed to face toward the inner space of the vaporization chamber 370 from one end side (upper side) of the vaporization chamber 370. A diameter of the discharge opening 362 of the spray nozzle 360 is determined in accordance with a target size of liquid droplets of the liquid source material discharged into the vaporization chamber 370. In order to reliably vaporize the liquid droplets in the vaporization chamber 370, the size of the liquid droplets needs to be reduced and, thus, it is preferable to reduce the diameter of the discharge opening 362 of the spray nozzle 360. However, if the size of the liquid droplets is reduced excessively, a flow rate of the source gas obtained by vaporizing the liquid droplets may be insufficient. Preferably, the diameter of the discharge opening 362 of the spray nozzle 360 is determined by considering the above. For example, the diameter of the discharge opening 362 is determined to be about 20 μm.

As for a material of the spray nozzle 360, it is preferable to use synthetic resin such as polyimide resin or the like which has resistance to an organic solvent, or metal such as stainless steel, titanium or the like. When the spray nozzle 360 is made of synthetic resin, heat from the periphery thereof can be prevented from being transferred to the liquid source material that has not yet been discharged. Further, in the case of using polyimide resin, the residue of the liquid source material (solidified substance) is hardly adhered to the spry nozzle 360, so that the nozzle clogging is prevented.

Furthermore, a carrier gas injection unit 336 is disposed at the one end side of the vaporization chamber 370 so as to surround the tip end of the spray nozzle 360. The carrier gas injection unit 336 is connected to the carrier gas flow path 330, and is configured to inject the carrier gas from the carrier gas flow path 330 toward the vaporization chamber 370 together with the liquid source material. To be specific, the carrier gas injection unit 336 is formed in a cup shape surrounding the tip end of the spray nozzle 360, and a carrier gas injection opening 338 is formed at a bottom portion thereof. The carrier gas injection opening 338 is formed near the discharge opening 362 provided at the tip end of the spray nozzle 360 so as to surround the discharge opening 362. By providing the discharge opening 362 of the spray nozzle 360 within the gas injection opening 338 having a diameter larger than that of the discharge opening 362, the carrier gas around the discharge opening 362 can be injected. Therefore, the liquid droplets of the liquid source material discharged from the discharge opening 362 can be reliably introduced into the vaporization chamber 370, and the travel of the liquid droplets of the liquid source material in the vaporization chamber 370 can become stable. Moreover, each of the liquid droplets can be reliably vaporized.

In addition, it is preferable that the diameter of the carrier gas injection opening 338 is smaller than that of the carrier gas flow path 330. For example, when the diameter of the carrier gas injection opening 338 is smaller than or equal to about 1/10 of the diameter of the carrier gas flow path 330, the carrier gas can flow through the first to the last vaporization module without deteriorating the conductance of the carrier gas flow path 330. Accordingly, the carrier gas can be injected at the same flow rate from the carrier gas injection opening 338 of the first to the last vaporization module 310 all the time.

The vaporization chamber 370, where a source gas is generated by vaporizing an atomized liquid source material discharged from a plurality of the spray nozzles 360, is formed in a substantially cylindrical shape having a circular cross section perpendicular to the discharge direction. With this shape, the position of the wall surface of the vaporization chamber 370 becomes isotropic with respect to the liquid droplets discharged from the spray nozzles 360. Accordingly, the heat from the sidewall heating unit 380 can be effectively transferred to the liquid droplets and, hence, the liquid source material can be vaporized more reliably.

As described in FIG. 4, the source gas outlet 372 disposed at the other end (deepest portion) of the vaporization chamber 370 is connected to the source gas flow path 340. The source gas generated in the vaporization chamber 370 is discharged to the outside through the source gas flow path 340, and is supplied to the film forming chamber 200 via the source gas supply line 132.

The temperature in the inner space of the vaporization chamber 370 is controlled by the sidewall heating unit 380 and the internal heating unit 382 to a level suitable for vaporization of liquid droplets of the liquid source material. Specifically, the temperature in the inner space of the vaporization chamber 370 is controlled to be higher than a vaporization temperature of the liquid source material and lower than a decomposition temperature for solidifying the liquid source material by the sidewall heating unit 380 and the internal heating unit 382. Due to the presence of the two heating units of the sidewall heating unit 380 and the internal heating unit 382, the vaporization efficiency of the liquid source material in the vaporization chamber 370 can be further increased. As a consequence, the length between both ends (dimension in the depth direction) of the vaporization chamber 370 can be further reduced, and the size in the longitudinal direction along the side surfaces of the respective vaporization modules 310 can be further reduced. Hence, the entire vaporizer 300 can be made compact.

Moreover, the vaporization efficiency of the liquid droplets of the liquid source material discharged to the vaporization chamber 370 can be controlled by changing the length between both ends of the vaporization chamber 370.

Further, on the side surface 312, circular ring-shaped grooves 312L, 312M and 312N are formed around the openings 322, 332 and 342 of the liquid material flow path 320, the carrier gas flow path 330 and the source gas flow path 340, respectively. In the same manner, on the side surface 314, circular ring-shaped grooves 314L, 314M and 314N are formed around the openings 324, 334 and 344 of the liquid material flow path 320, the carrier gas flow path 330 and the source gas flow path 340, respectively.

Figure 7:
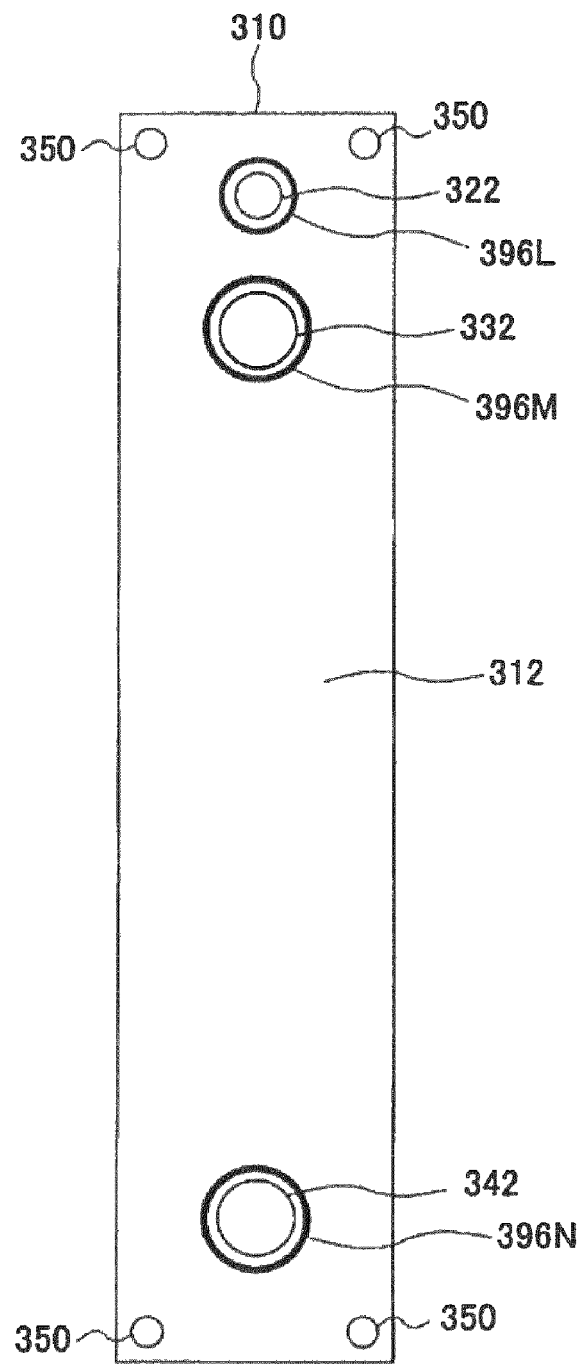
FIG. 7 is a side view of the vaporization module of FIG. 4 which is seen from an arrow II direction.

When the side surface 312 of the vaporization module 310 is closely adhered to a side surface of another vaporization module, in order to reliably prevent the leakage of the liquid source material, the carrier gas and the source gas, O-rings 396L, 396M and 396N are inserted into the circular ring-shaped grooves 312L, 312M and 312N, respectively, as illustrated in FIG. 7. In the same manner, when the side surface 314 of the vaporization module 310 is closely adhered to a side surface of another vaporization module, the O-rings 396L, 396M and 396N are inserted into the circular ring-shaped grooves 314L, 314M and 314N, respectively (this case not being shown).

Hereinafter, the shapes of the vaporization module 310 and the liquid material flow path 320 seen from the top will be described in detail with reference to FIG. 6. The vaporization module 310 has an outer shape having a rectangular cross section. Further, as described above, the liquid material flow path 320 penetrates the inside of the module, and the openings 322 and 324 are formed on the side surfaces 312 and 314, respectively. The liquid material flow path 320 is connected to the spray nozzle 360, and the liquid material flowing in the liquid material flow path 320 is supplied to the spray nozzle 360.

A flow path width (size of the cross section perpendicular to the flow direction) of the liquid material flow path 320 may be set constant between the openings 322 and 324, or may be enlarged near a connecting portion thereof with the spray nozzle 360 as can be seen from FIG. 6. With such configuration, the liquid material flowing in the liquid material flow path 320 can stay for a while near the connecting portion, and the supply of the liquid source material to the spray nozzle 360 becomes stable.

The shapes of the carrier gas flow path 330 and the source gas flow path 340 seen from the top (not shown) are the same as that of the source gas flow path 320 shown in FIG. 6. As such, the liquid material flow path 320, the carrier gas flow path 330 and the source gas flow path 340 penetrate the inside of the module linearly. Thus, when the vaporization module 310 is seen from the plane direction, each of the flow paths has an "I" shape.

As depicted in FIGS. 2 and 3, in the vaporization module 310 having the above-described configuration in accordance with the first embodiment, a plurality of the vaporization modules 310 (310A to 310c) can be connected to one another along the flow directions of the liquid source material, the carrier gas and the source gas. In that case, the vaporization modules 310A to 310C can be connected to one another by using clamping units such as the bolts 392A and the nuts 392B, so that the assembly of the vaporizer 300 can be performed in a short period of time.

Moreover, in the vaporizer 300 formed by the vaporization modules 310, the liquid material flow paths 320A to 320C communicate with each other, the carrier gas flow paths 330A to 330C communicate with each other, and the source gas flow paths 340A to 340C communicate with each other in the vaporization modules 310 without stepped portions, thereby forming the single liquid material flow path 320, the single carrier gas flow path 330, and the single source gas flow path 340 which continue through the first vaporization module 310A to the last vaporization module 310C. As a result, the liquid source material, the carrier gas, and the source gas can smoothly flow in the vaporizer 300. The detailed description of this flow will be provided later.

FIGS. 2 and 3 illustrate the vaporizer 300 formed by connecting three vaporization modules 310 (310A to 310C). However, this is only an example, and the number of the vaporization module 300 connected in accordance with the first embodiment is not limited. In other words, two vaporization modules 310 may be connected to each other, or four or more vaporization modules 310 may be connected to one another. Besides, the reassembling operation of the vaporizer 300 which is required to change the number of vaporization modules 310 is extremely easy.

Flow of Liquid Source Material, Carrier Gas and Source Gas

Figure 8:
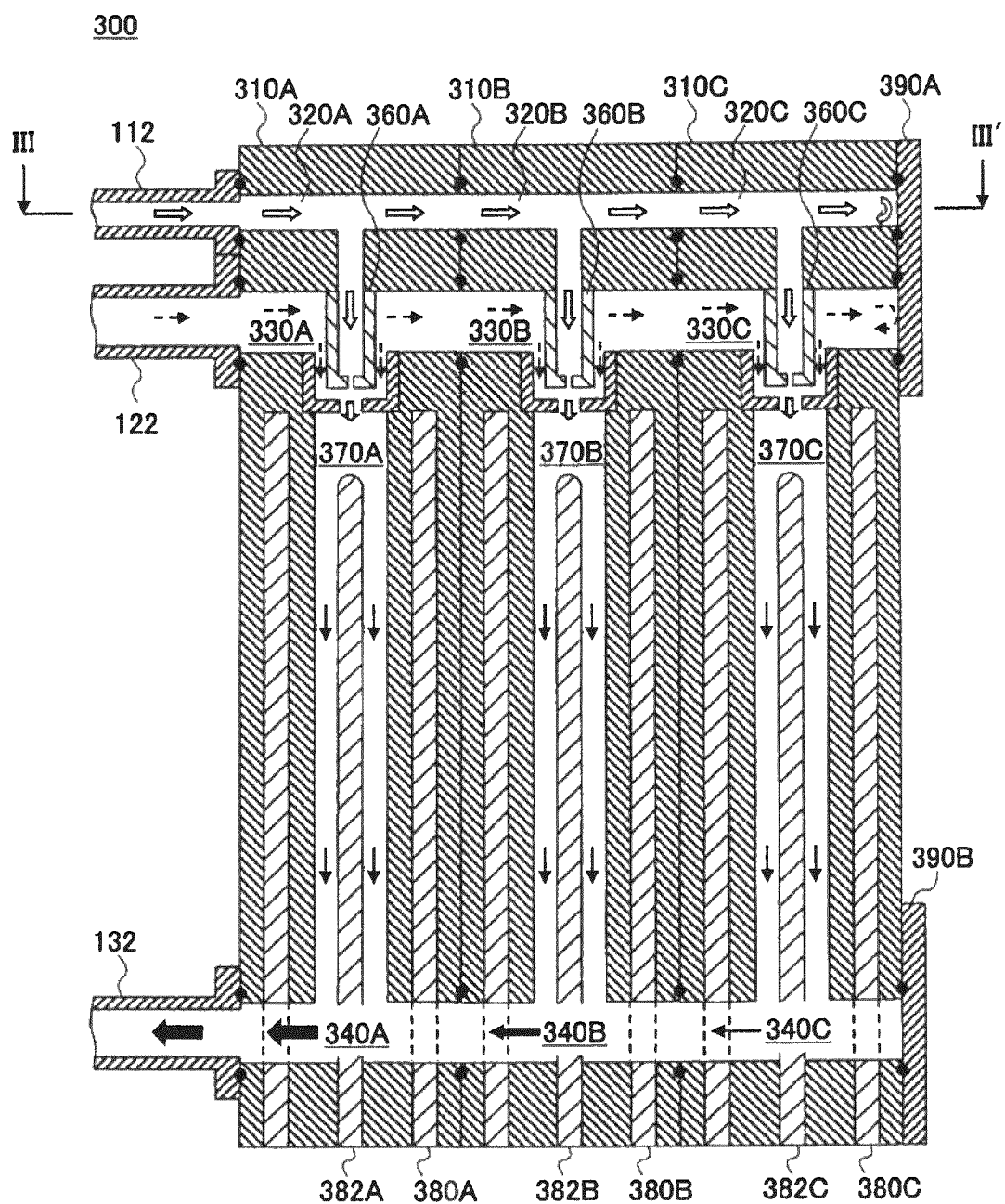
FIG. 8 provides a vertical cross sectional view showing a schematic configuration example of the vaporizer in accordance with the first embodiment of the present invention.

Hereinafter, the flow of the liquid source material, the carrier gas, and the source gas in the vaporizer 300 in accordance with the first embodiment will be described with reference to the drawings. FIG. 8 is a vertical cross sectional view of the vaporizer 300 which explains the flow of the liquid source material, the carrier gas, and the source gas in the vaporizer 300 in accordance with the first embodiment, and FIG. 9 provides a III-III' cross section of the vaporizer 300 of FIG. 8 when seen from the direction of arrows.

Figure 9:
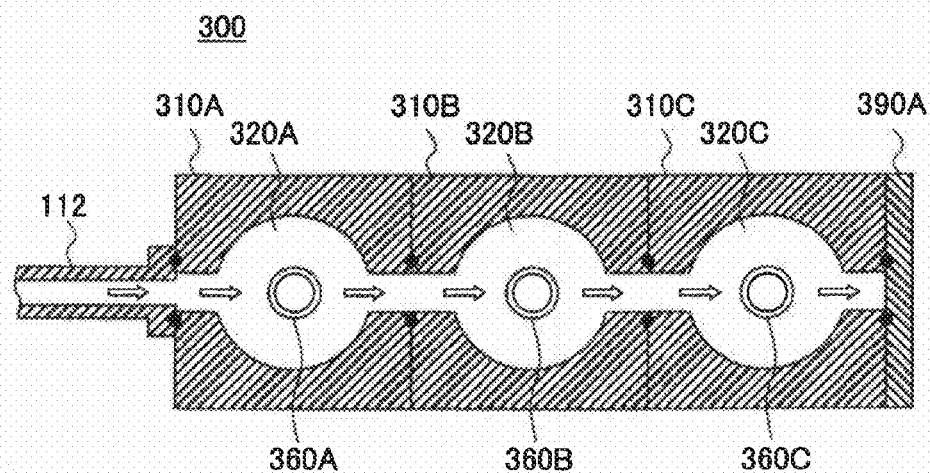
FIG. 9 illustrates a III-III' cross sectional view of the vaporizer of FIG. 8.

In FIGS. 8 and 9, the flow directions of the liquid source material, the carrier gas, and the source gas are indicated by white arrows, dashed arrows, and black arrows, respectively.

In order to generate a source gas by the vaporizer 300, a liquid source material is supplied at a predetermined flow rate from the liquid material supply source 110 to the vaporizer 300 via the liquid material supply line 112 by controlling an opening degree of the liquid material flow path control valve 114. At the same time, it is preferable to supply a carrier gas at a predetermined flow rate from the carrier gas supply source 120 to the vaporizer 300 via the carrier gas supply line 122 by controlling an opening degree of the carrier gas flow rate control valve 124. Further, with respect to the vaporizer 300, it is preferable to control the temperatures in the respective vaporizers 370A to 370C to predetermined levels by the sidewall heating units 380A to 380C and the internal heating units 382A to 382C provided at the respective vaporization modules 310A to 310C.

The liquid source material supplied to the vaporizer 300 via the liquid material supply line 112 is firstly introduced into the liquid material flow path 320A of the first vaporization module 310A. Next, the liquid source material is introduced into the liquid material flow path 320B of the next vaporization module 310B connected to the vaporization module 310A, and then to the liquid material flow path 320C of the next succeeding vaporization module 310C connected to the vaporization module 310B.

As set forth above, when the vaporization modules 310A to 310C are connected to one another, the liquid material flow paths 320A to 320C provided thereat respectively become the single liquid material flow path 320 having no stepped portion in the vaporizer 300. Therefore, the liquid source material is smoothly supplied from the first vaporization modules 310A to the last vaporization modules 310C. Moreover, the downstream opening of the liquid material flow path 320, i.e., the opening 322C of the liquid material flow path 320C, is blocked by the end plate 390A, so that the single liquid material flow path 320 serves as a common liquid material chamber.

Accordingly, once the liquid source material is supplied at a predetermined pressure to the liquid material flow path 320A of the first vaporization module 310A, the liquid source material is also supplied to the vaporization modules 310B and 310C via the liquid material flow paths 320B and 320C of the respective vaporization modules 310B and 310C and filled therein.

Simultaneously with the supply of the liquid source material, the carrier gas is supplied to the vaporizer 300 via the carrier gas supply line 122. Next, the carrier gas is introduced into the carrier gas flow path 330A of the first vaporization module 310A. Thereafter, the carrier gas is introduced into the carrier gas flow path 330B of the vaporization module 310B connected to the vaporization module 310A, and then into the carrier gas flow path 330C of the vaporization module 310C connected to the vaporization module 310B.

As described above, when the respective vaporization modules 310A to 310C are connected to one another, the carrier gas flow paths 330A to 330C provided thereat respectively become the single carrier gas flow path 330 having no stepped portion in the vaporizer 300. Thus, the carrier gas is smoothly supplied from the first vaporization module 310a to the last vaporization module 310C.

Once the carrier gas is supplied to the carrier gas flow paths 330A to 330C in the vaporizer 300, the carrier gas is injected through the carrier gas injection openings of the carrier gas injection units communicating with the respective carrier gas flow paths 330A to 330C toward the respective vaporization chambers 370A to 370C around the discharge openings 362 of the spray nozzles 360A to 360C. Accordingly, liquid droplets of the liquid source material continuously discharged from the discharge openings 362 of the respective spray nozzle 360A to 360C can stably travel with the carrier gas flow in a predetermined direction (vertical direction) in the respective vaporization chambers 370A to 370C.

Further, the downstream opening of the carrier gas flow path 330C of the last vaporization module 310C is blocked by the end plate 390A, so that the carrier gas can be injected through the carrier gas injection openings of all the vaporization modules simultaneously.

It is preferable to set the flow path width of the carrier gas flow path 330 in accordance with the diameter of the carrier gas injection opening 338 and the flow rate of the carrier gas. When the carrier gas is injected at an optimum amount through the respective carrier gas injection openings 338, the vaporization efficiency in the respective vaporization modules 310A to 310C can be increased and, also, the traveling stability of the liquid droplets of the liquid source material can be improved.

In the first embodiment, the temperatures in the respective vaporization chambers 370A to 370C into which the liquid droplets of the liquid source material are introduced are controlled to predetermined levels in advance by the sidewall heating units 380A to 380C and the internal heating units 382A to 382C. Thus, the liquid droplets of the liquid source material which are discharged through the discharge openings 362 provided at the one ends of the respective vaporization chambers 370A to 370C and travel toward the other ends (deepest portions) thereof are completely vaporized before reaching the other ends, thereby generating a source gas.

The source gas generated in the vaporization chambers 370A to 370C is supplied to the respective source gas flow paths 340A to 340C, and then is supplied to the source gas supply line 132 connected to the source gas flow path 340A of the first vaporization module 310A.

As described above, when the vaporization modules 310A to 310C are connected to one another, the source gas flow paths 340A to 340C provided thereat communicate with each other and become the single source gas flow path 340 having no stepped portion in the vaporizer 300. Accordingly, the source gas smoothly flows from the first vaporization module 310A to the last vaporization module 310C, and then is discharged to the source gas supply line 132.

The source gas discharged to the source gas supply lines 132 is supplied to the film forming chamber 200, and then is introduced into the inner space 242 of the shower head 240. Next, the source gas is injected through the gas injection openings 244 toward the semiconductor wafer W on the susceptor 222. As a consequence, a predetermined film, e.g., a film containing an organic metal compound, is formed on the semiconductor wafer W.

Moreover, the end portion of the source gas flow path 340 is blocked by the end plate 390B, so that the source gas is prevented from leaking to the outside. Therefore, the source gas can be supplied to the film forming chamber 200 reliably and without waste.

Preferably, a diameter of the source gas supply line 132 and a flow path width of the source gas flow path 340 are set in accordance with the capacity of the respective vaporization chambers 370A to 370C and the maximum number of vaporization modules 310 that can be connected. Accordingly, the pressures in the respective vaporization chambers 370A to 370C can be maintained within predetermined levels, and the liquid source material in the vaporization chambers 370A to 370C can be vaporized with high efficiency.

As set forth above, in accordance with the first embodiment, the liquid material flow paths 320A to 320C of the respective vaporization modules 310A to 310C communicate with one another by connecting the side surfaces of the respective vaporization modules 310A to 310C, and thus can serve as a common liquid material chamber. Therefore, once the liquid source material is supplied at a predetermined pressure to the liquid material flow path 320A of the vaporization module 310A, the liquid source material is also supplied to the vaporization modules 320B and 320C and filled therein. As a result, the liquid source material can be simultaneously discharged through the discharge openings 362 of the spray nozzles 360A to 360C of the vaporization modules 310A to 310C to the vaporization modules 370A to 370C, respectively, and then vaporized therein.

In addition, the carrier gas flow paths 330A to 330C of the vaporization modules 310A to 310C as well as the liquid material flow paths 320A to 320C communicate with each other by connecting the side surfaces of the respective vaporization modules 310A to 310C. Thus, once the carrier gas is supplied to the carrier gas flow path 330A of the vaporization module 310A, the carrier gas can be supplied to the vaporization modules 310B and 310C via the carrier gas flow paths 330A to 330C communicating with one another. Subsequently, the carrier gas can be injected toward the vaporization chambers 370A to 370C in the respective vaporization modules 310A to 310C together with the liquid source material.

Consequently, the flow rate of the source gas generated in the entire vaporizer 300 can be controlled simply by increasing or decreasing the number of vaporization modules 310 connected to one another. Therefore, the structure of the vaporizer 300 can be easily changed in accordance with various flow rates of the source gas in a range from low to high levels.

Besides, there is no need to change the size of the discharge openings 362 of the spray nozzles 360 of the respective vaporization modules 310A to 310C and the like in accordance with the flow rate of the source gas. Thus, the flow rate of the source gas can be increased while maintaining the optimum vaporization efficiency in the respective vaporization modules 310A to 310C and without reexamining the reliability thereof. For that reason, deterioration of a manufacturing throughput can be suppressed, and a development cost for a new vaporizer is not incurred. In addition, since the type of the vaporization modules 310 to be managed is the same, the management of the vaporizer 300 becomes simple.

By connecting a plurality of the block-shaped vaporization modules 310 at their side surfaces to one another, the vaporization modules 310 can be integrated. Accordingly, the entire vaporizer 300 can be made compact compared to the case where, e.g., the flow paths of the vaporization modules are connected by lines.

Each of the vaporization modules 310 in accordance with the first embodiment is provided with one spray nozzle 360 (one discharge opening 362 for the liquid source material). Thus, if the number of vaporization modules 310 is increased by one, the number of the spray nozzle 360 is increased by one. With this configuration, the flow rate of the source gas to be generated can be finely controlled in a unit of each spray nozzle 360.

Second Embodiment

Figure 10:
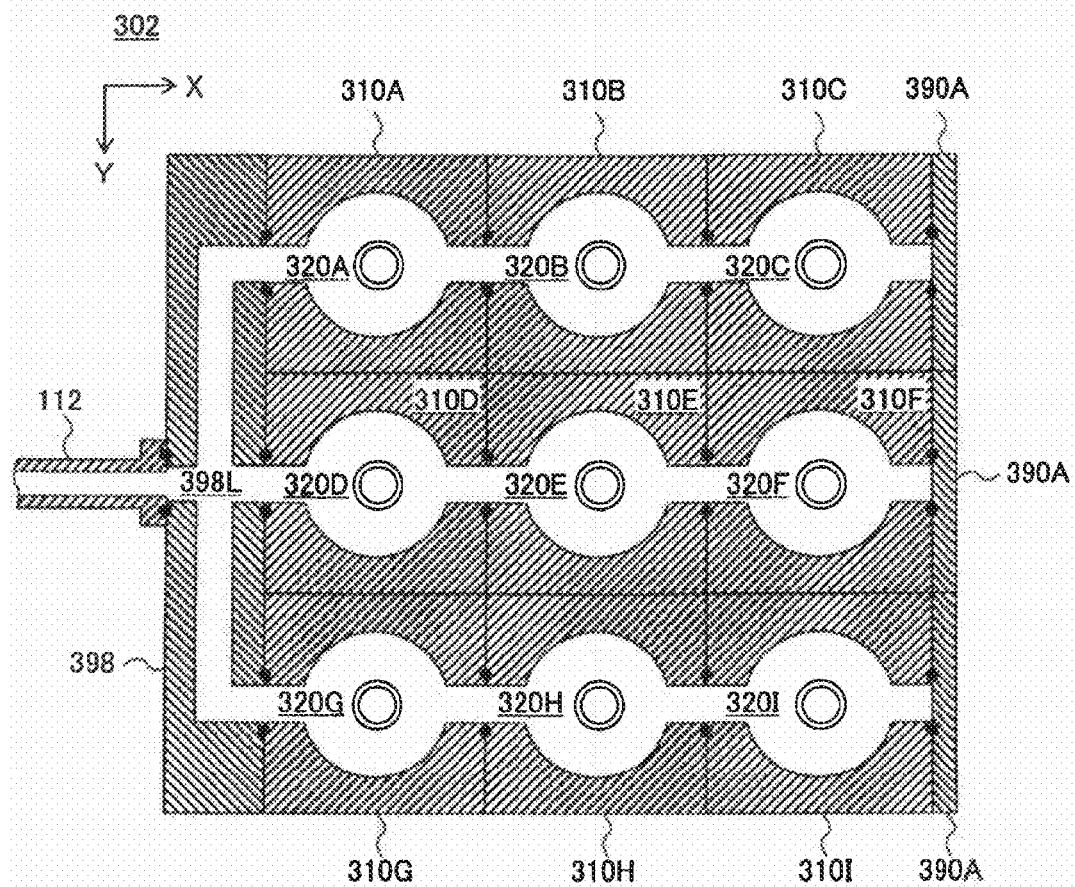
FIG. 10 depicts a horizontal cross sectional view of a schematic configuration example of a vaporizer in accordance with a second embodiment of the present invention.

Hereinafter, a configuration example of a vaporizer 302 in accordance with a second embodiment of the present invention will be described with reference to the drawings. FIG. 10 is a cross sectional view schematically showing the configuration of the vaporizer 302 in accordance with the second embodiment, and shows a horizontal cross section of a liquid material flow path in the vaporizer 302 seen from the top as in the cross sectional view of the vaporizer 300 of FIG. 9. Although the first embodiment describes, as an example, the vaporizer 300 formed by connecting a plurality of the vaporization modules 310 in a single row, the second embodiment shows, as an example, the vaporizer 302 formed by connecting the vaporization modules 310 having the same configuration as that of the first embodiment in a plurality of (three in this embodiment) rows.

Specifically, the vaporizer 320 in accordance with the second embodiment is formed by connecting nine vaporization modules 310A to 310I in three rows, as shown in FIG. 10. In other words, the vaporization modules 310A to 310C are connected in a first row; the vaporization modules 310D to 310F are connected in a second row; and the vaporization modules 301G to 310I are connected in a third row. Moreover, the vaporization modules in each row are arranged in a row direction (X direction) perpendicular to a column direction (Y direction) and connected to one another in the row direction without gaps.

The vaporization modules 310A to 310C, 310D to 310F and 310G to 310I in the respective rows have parallel side surfaces serving as joint surfaces, and are connected at their joint surfaces to one another in a single row. Accordingly, liquid material flow paths, carrier gas flow paths and source gas flow paths formed in the respective vaporization modules 310A to 310C, 310D to 310F and 310G to 310I communicate with each other through the respective vaporization modules 310A to 310C, 310D to 310F and 310G to 310I.

Further, in the vaporizer 302 in accordance with the second embodiment, a flow path block (flow path module) 398 is connected to the first vaporization modules 310A, 310D and 310G in the respective rows, and end plates 390A as shown in FIG. 3 for example are connected to the last vaporization modules 310C, 310F and 310I in the respective rows. Each of the end plates 390A blocks end openings of the liquid material flow paths 320C, 320F and 320I of the last vaporization modules 310C, 310F and 310I in the respective rows, and also blocks end openings of the carrier gas flow paths (not shown). Moreover, although it is not illustrated, end plates (corresponding to the end plates 390B shown in FIG. 3) for blocking end openings of the source gas flow paths of the last vaporization modules 310C, 310F and 320I in the respective rows are also connected thereto. The end plates 390A and 390B in each row may be formed as a single plate in each row.

As shown in FIG. 10, the flow path block 398 includes therein a liquid material inlet path 398L for introducing a liquid source material from the liquid material supply source 110 through a single liquid material inlet port and dividing the liquid source material into a plurality of flows corresponding to the number of rows. The liquid material supply line 112 is connected to the liquid material inlet port of the flow path block 398. Therefore, the liquid source material introduced from the liquid material supply line 112 to the liquid material inlet port of the flow path block 398 is divided into three parts in the liquid material inlet path 398L and supplied to the liquid material flow paths 320A, 320D and 320G of the first vaporization modules 310A, 310D and 310G in the respective rows.

Further, although it is not illustrated, the flow path block 398 is provided with a carrier gas inlet path for dividing the carrier gas from the carrier gas supply source 110 into a plurality of flows corresponding to the number of rows. The shape of the carrier gas inlet path is the same as that of, e.g., the liquid material inlet path 398L. The carrier gas supply line 122 is connected to a carrier gas inlet port of the flow path block 398. Accordingly, the carrier gas introduced from the carrier gas supply line 122 to the carrier gas inlet port of the flow path block 398 is divided into three parts in the carrier gas inlet path and supplied to the carrier gas flow path of the first vaporization modules 310A, 310D and 310G in the respective rows.

In addition, although it is not shown, the flow path block 398 is provided with a source gas outlet path for combining the source gases generated from the vaporization modules in the respective rows and discharging the combined gas through a single source gas outlet port. The shape of the source gas outlet path is the same as that of, e.g., the liquid material inlet path 398L. In that case, the liquid material outlet port corresponds to the source gas outlet port. The source gas supply line 132 is connected to the source gas outlet port of the flow path block 398. Accordingly, the source gases generated in the vaporization modules in the respective row are discharged from the source gas flow path of the first vaporization modules 310A, 310D and 310G in the respective rows to the source gas outlet path of the flow path block 398, and then are combined together in the source gas outlet path and discharged to the source gas supply line 122.

In the vaporizer 302 in accordance with the second embodiment, once the liquid source material is supplied at a predetermined pressure to the liquid material inlet port of the flow path block 398, the liquid source material is then fed to the first liquid material flow paths 320A, 320D and 320G of the vaporization modules 310A, 310D, 310G in the respective rows and then to the last vaporization modules 310C, 310F and 310I in the respective rows via the liquid material flow paths of the vaporization modules and filled therein. Therefore, the liquid source material can be simultaneously discharged from the outlet ports of the vaporization modules 310A to 310I.

Simultaneously, the carrier gas is supplied at a predetermined flow rate to the carrier gas inlet port of the flow path block 398. Accordingly, the carrier gas is supplied to the carrier gas flow paths of the first vaporization modules 310A, 310D and 310G in the respective rows, and then to the last vaporization modules 310C, 301F and 310I in the respective rows via the carrier gas flow paths of the vaporization modules connected thereto. Thus, the carrier gas can be simultaneously injected toward the vaporization chambers in the vaporization modules 310A to 310I together with the liquid source material.

In this way, the source gases generated in the respective vaporization modules 310A to 310I are discharged from the first vaporization modules 310A, 301D and 310G in the respective rows, and then are combined together in the source gas outlet path of the flow path block 398 and discharged to the source gas supply line 132.

Therefore, in the vaporizer 302 in accordance with the second embodiment as well as in the vaporizer 300 in accordance with the first embodiment, the flow rate of the source gas generated in the entire vaporizer can be easily controlled simply by increasing the number of vaporization modules connected to one another. Accordingly, even when a flow rate of the source gas which is required for, e.g., film formation, is changed, the structure of the vaporizer can be easily changed in accordance with the flow rate of the source gas.

Further, in the vaporizer 302 in accordance with the second embodiment, the vaporization modules 310 can be connected so as to extend linearly in the column direction (Y direction) as well as in the row direction (X direction) perpendicular thereto. Since the vaporization modules 310 can be arranged in a matrix pattern as in the vaporizer 302 in accordance with the second embodiment, a large number of vaporization modules can be integrated more compactly. For example, even when the number of vaporization modules 310 that can be connected in the X direction is limited due to the restriction of the installation space of the film forming apparatus 100, a plurality of vaporization modules 310 can be connected in the Y direction in accordance with a desired flow rate of the source gas.

Third Embodiment

Figure 11:
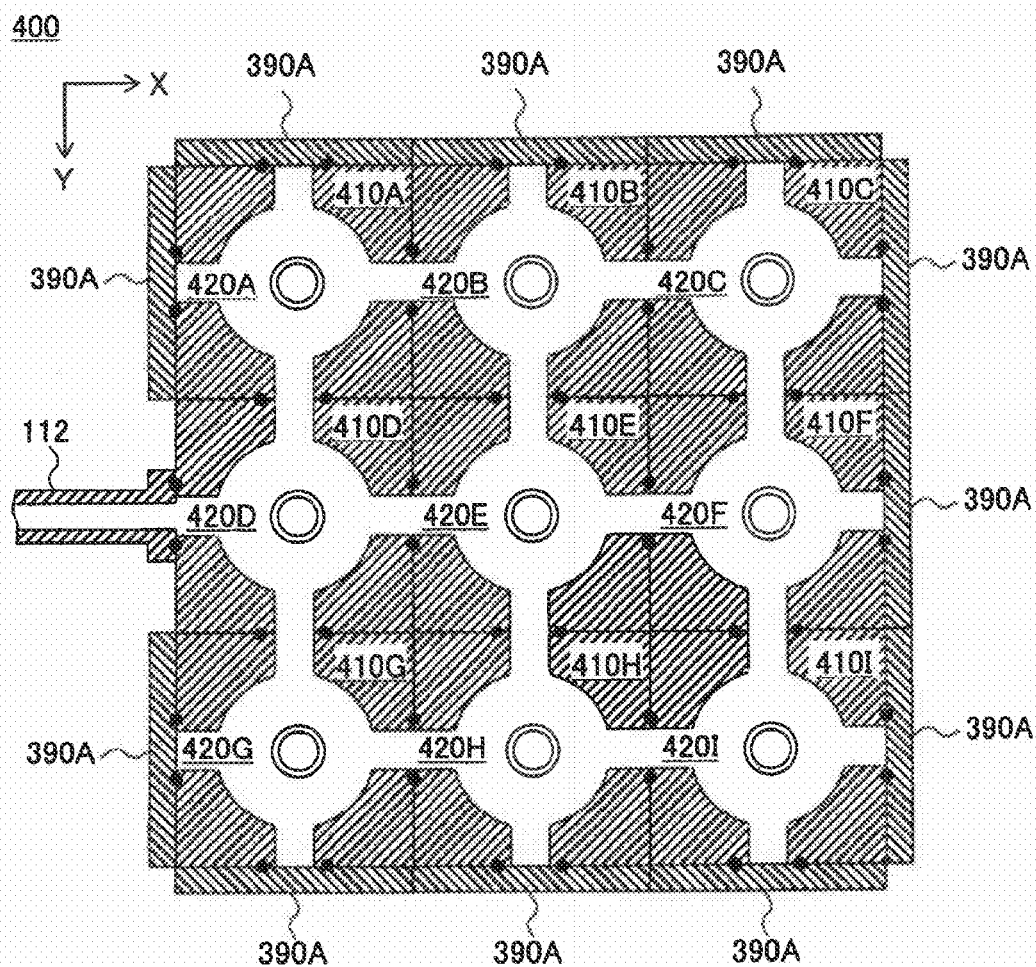
FIG. 11 describes a horizontal cross sectional view of a schematic configuration example of a vaporizer in accordance with a third embodiment of the present invention.

Hereinafter, a configuration example of a vaporizer 400 in accordance with a third embodiment of the present invention will be described with reference to the drawings. FIG. 11 is a cross sectional view schematically showing the configuration example of the vaporizer 400 in accordance with the third embodiment, and illustrates a horizontal cross section of liquid material flow paths in the vaporizer 400 seen from the top as in the cross sectional view of the vaporizer 302 of FIG. 10. In the third embodiment, there is described as an example of the vaporizer 400 formed by connecting vaporization modules 410A to 410I in a matrix pattern which are different in the configuration of the flow paths (liquid material flow path, carrier gas flow path, source gas flow path) from the vaporization modules 310A to 310I shown in FIG. 10.

Figure 12:
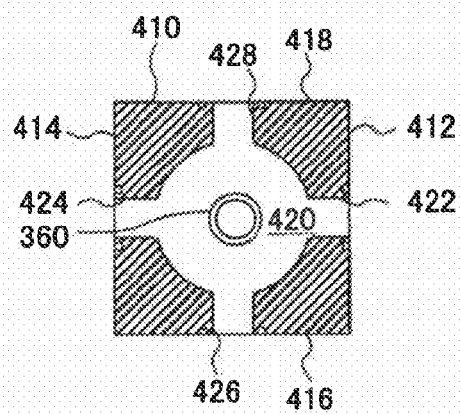
FIG. 12 offers a horizontal cross sectional view of a schematic configuration example of a vaporization module having a cross-shaped flow path in accordance with the third embodiment.

The configuration example of the vaporization modules 410A to 410I in accordance with the third embodiment will be described with reference to the drawings. Here, the vaporization modules 410A to 410I have substantially the same configuration, so that the configuration example of the vaporization module 410 will be described representatively. FIG. 12 is a cross sectional view schematically showing a configuration example of the vaporization module 410 of the third embodiment, and illustrates a horizontal cross section of a liquid material flow path of the vaporization module 410 seen from the top as in the cross sectional view of the vaporization module 310 of FIG. 6.

The vaporization module 410 of FIG. 12 is the same as the vaporization module 310 of FIG. 6 in that it is formed in a block shape having a rectangular (square in this embodiment) cross section, but is different therefrom in the configurations of the flow path, e.g., liquid material flow path and the like, except other configurations of inner components (e.g., spray nozzle, vaporization chamber, carrier gas injection unit and the like).

Specifically, the liquid material flow path 420 of the vaporization module 410 of FIG. 12 is different from the liquid material flow path 320 of the vaporization module 310 of FIG. 6 in that the liquid material flow path 420 is extended to penetrate four side surface (two pairs of parallel side surfaces) 412 to 418 whereas the liquid material flow path 320 is extended to penetrate only a pair of parallel side surfaces 312 and 314. For example, the liquid material flow path 420 is extended to penetrate the inside of the vaporization module 410 in a cross pattern. The penetration of the liquid material flow path 420 through the four side surface 412 to 418 results in formation of four openings 422 to 428. The side surfaces 412 to 418 serve as joint surfaces where the vaporization module 410 is closely connected to other vaporization modules to thereby form the vaporizer 400.

Although it is not shown, the flow paths other than the liquid material flow path 420 formed in the vaporization module, i.e., the carrier gas flow path and the source gas flow path, penetrate the four side surfaces 412 to 418 of the vaporization module 410 in a cross pattern as same as the liquid material flow path 420.

A vaporizer can be formed by connecting the vaporization module having the cross pattern flow path in accordance with the third embodiment to one another in the column direction (Y direction) as well as in the row direction (X direction) perpendicular thereto. FIG. 11 shows a configuration example of the vaporizer 400 in which nine vaporization modules 410A to 410I having the configuration in accordance with the third embodiment are connected to one another in the row direction (X direction) as well as the column direction (Y direction) in a matrix pattern. Like this, by connecting the respective vaporization modules 410A to 410I, liquid material flow paths 420A to 420I formed in the respective vaporization modules 410A to 410I communicate with each other and the carrier gas flow paths communicate with each other, and the source gas flow paths communicate with each other.

In the vaporizer 400 of FIG. 11, the liquid material supply line 112, the carrier gas supply line 122 and the source gas supply line 132 are connected to the liquid material flow path 420D, the carrier gas flow path and the source gas flow path of one (here, the vaporization modules 410D) of the vaporization modules 410A to 410I, respectively. To be specific, the liquid material supply line 112 is connected to an opening facing the outside of the vaporizer 400 among four openings of the liquid material flow path 420D of the vaporization module 410D, i.e., an opening of the liquid material flow path 420D which opens at a side surface that is not connected to another vaporization module. Further, with respect to the carrier gas flow path and the source gas flow path, the carrier gas supply line 122 and the source gas supply line 132 are respectively connected to the openings of the carrier gas flow path and the source gas flow path of the vaporization module 410D which open at the side surface that is not connected to another vaporization module among the four openings of each of the carrier gas flow path and the source gas flow path of the vaporization module 410D.

Moreover, in the vaporization modules 410A to 410C, 410E to 410I other than the vaporization module 410D, the end plates 390A and 390B same as those shown in FIG. 3 are adhered to the side surfaces facing the outside of the vaporizer 400, i.e., those that are not connected to other vaporization modules. The end plates 390A block the openings of the liquid material flow path and the carrier gas flow path which open at the side surfaces that are not connected to other vaporization modules, and the end plates 390B block the openings of the source gas flow paths which open at the side surfaces that are not connected to other vaporization modules. Besides, the end plates 390A and 390B attached to the vaporization modules may be formed as a unit.

In the vaporizer 400 in accordance with the third embodiment, by connecting the vaporization modules 410A to 410I at their side surfaces to one another in the row direction as well as the column direction, the liquid material flow paths 420A to 420I of the vaporization modules 410A to 410I are connected in the row direction as well as in the column direction and thus can serves as a common liquid material chamber. Accordingly, once the liquid source material is supplied at a predetermined pressure to the liquid material flow path 420D of the vaporization module 410D, the liquid source material is also supplied to the other vaporization modules 410A to 410C and 410E to 410I and filled therein. Thus, the liquid source material can be simultaneously discharged through the discharge openings 362 of the spray nozzles 360 of the respective vaporization modules 410A to 410I.

Moreover, by connecting the respective vaporization modules 410A to 410I at their side surfaces to one another, the carrier gas flow paths and the source gas flow paths of the respective vaporization modules 410A to 410I as well as the liquid material flow paths 420A to 420I communicate with each other. Therefore, once the carrier gas is supplied to the carrier gas flow path of the vaporization module 410D, the carrier gas can also be supplied to the other vaporization modules 410A to 410I via the carrier gas flow paths communicating with one another. Accordingly, the carrier gas can be simultaneously discharged toward the vaporization chambers in the respective vaporization modules 410A to 410I together with the liquid source material.

In this way, the source gases generated in the respective vaporization modules 410A to 410I of the vaporizer are combined in the vaporization module 410D and then discharged to the source gas supply line 132.

Therefore, in the vaporizer 400 in accordance with the third embodiment as well as the vaporizers 300 and 302 in accordance with the first and the second embodiment, the flow rate of the source gas generated in the entire vaporizer 400 can be easily controlled simply by increasing or decreasing the number of vaporization modules 410 connected to one another. As a consequence, the structure of the vaporizer 400 can be easily changed in accordance with various flow rates of the source gas in a range from low to high levels.

Further, the liquid material flow paths, the carrier gas flow paths and the source gas flow paths of the vaporization modules 410A to 410I communicate with each other in the column direction (Y direction) as well as in the row direction (X direction). Thus, the liquid source material, the carrier gas and the source gas can flow more effectively. Accordingly, it is possible to shorten a period of time required to fill the liquid source material in the liquid material flow paths, which can improve a throughput. Moreover, the liquid material flow paths, the carrier gas flow paths and the source gas flow paths of the respective vaporization modules 410A to 410I communicate with each other in the column direction (Y direction) as well as in the row direction (X direction). For that reason, the liquid source material and the carrier gas may be supplied to any one of the vaporization modules, and the flow path block 398 shown in FIG. 10 becomes unnecessary.

In the vaporizer 400 in accordance with the third embodiment as well as the vaporizer 302 in accordance with the second embodiment, when the number of vaporization modules 410 that can be connected in the row direction (X direction) is limited, it is possible to increase the number of vaporization modules 410 connected in the column direction (Y direction) perpendicular thereto. As a result, the vaporizer 400 can be formed by connecting a desired number of vaporization modules 410.

Besides, the vaporizer 400 in accordance with the third embodiment is formed by the vaporization modules 410 that have substantially the same configuration. Therefore, the management of the vaporization modules becomes simple, and the assembly of the vaporizer 400 becomes easy.

In the vaporizer 400 in accordance with third embodiment, the liquid material supply line 112, the carrier gas supply line 122 and the source gas supply line 132 can be connected to any vaporization module positioned at an outer side of the main body (all of the vaporization modules except for the vaporization module 410E in the example of FIG. 11). Accordingly, the vaporization module to which the liquid material supply line 112, the carrier gas supply line 122 and the source gas supply line 132 are connected can be selected in accordance with the attachment position of the vaporizer 400 in the film forming apparatus 100. At that time, the liquid material supply line 112, the carrier gas supply line 122 and the source gas supply line 132 may be separately connected to different vaporization modules.

Fourth Embodiment

Figure 13:
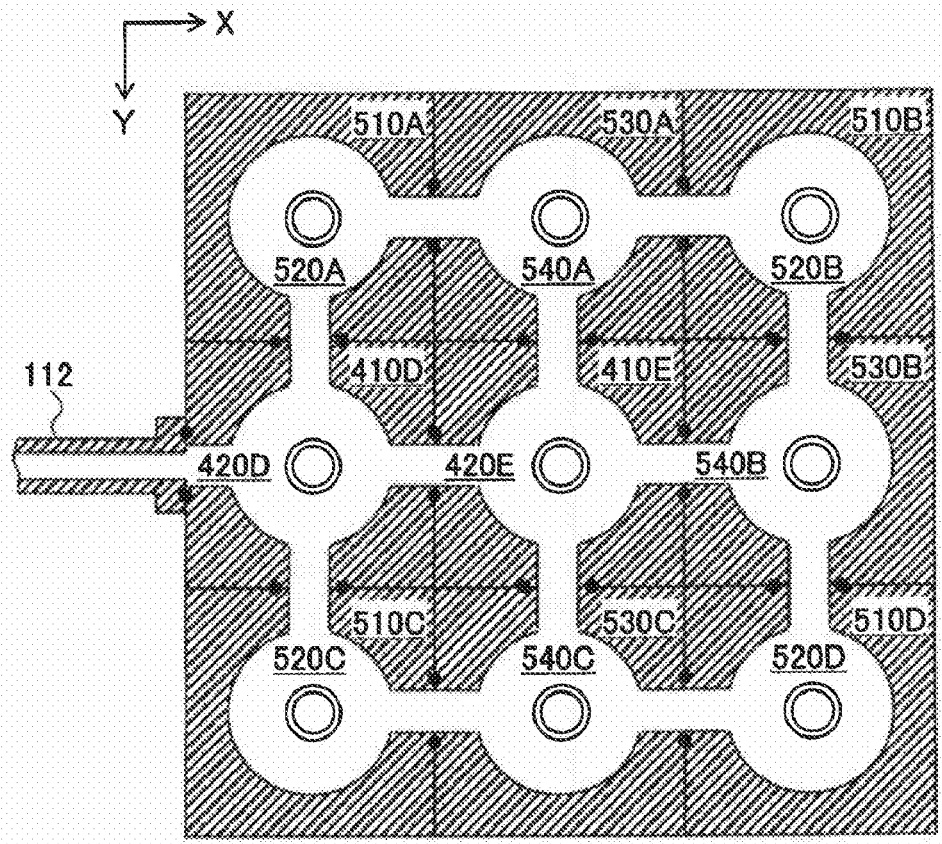
FIG. 13 is a horizontal cross sectional view of a schematic configuration example of a vaporizer in accordance with a fourth embodiment of the present invention.

Hereinafter, a configuration example of a vaporizer 500 in accordance with a fourth embodiment of the present invention will be described with reference to the drawings. FIG. 13 is a cross sectional view schematically showing the configuration example of the vaporizer 500 in accordance with the fourth embodiment, and illustrates a horizontal cross section of the liquid material flow paths of the vaporizer 500 seen from the top as in the cross sectional view of the vaporizer 400 in FIG. 11.

As shown in FIG. 13, in the vaporizer 500 in accordance with the fourth embodiment, the vaporization modules 410A to 410C and 410F to 410I except for the vaporization modules 410D and 410E in the vaporizer 400 of FIG. 11 are replaced with a vaporization module 510 or 530. Specifically, in the vaporizer 500, the vaporization modules 410A, 410C, 410G and 410I corresponding to corner portions are replaced with the vaporization modules 510A to 510D, and the vaporization modules 410B, 410F and 410H other than the corner portions are replaced with the vaporization modules 530A to 530C.

Figure 14:
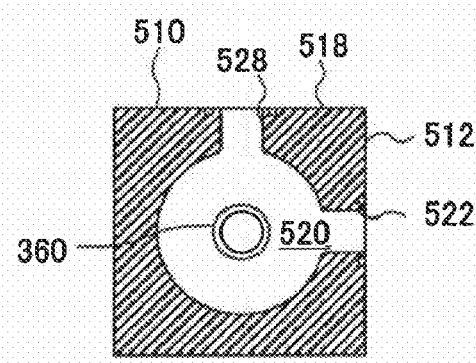
FIG. 14 provides a horizontal cross sectional view of a schematic configuration example of a vaporization module having an L-shaped flow path in accordance with the fourth embodiment.

A configuration example of the vaporization modules 510A to 510D positioned at four corners among all the vaporization modules will be described with reference to the drawings. Since the vaporization modules 510A to 510D have substantially the same configuration, the configuration example of the vaporization module 510 will be described representatively. FIG. 14 is a cross sectional view schematically showing the configuration example of the vaporization module 510 in accordance with the fourth embodiment, and illustrates a horizontal cross section of the liquid material flow path of the vaporization module 510 seen from the top as in the cross sectional view of the vaporization module 410 shown in FIG. 12.

The vaporization module 510 of FIG. 14 has the same configuration as that of the vaporization module 310 of FIG. 6 with respect to the inner components (e.g., spray nozzle, vaporization chamber, carrier gas injection unit and the like) and the block shape having a rectangular cross section, but is different therefrom in the configurations of the flow path, e.g., liquid material flow path and the like. Specifically, the liquid material flow path 520 of the vaporization module 510 of FIG. 14 is different from the liquid material flow path 320 of the vaporization module 310 of FIG. 6 in that the liquid material flow path 520 is extended to penetrate only two side surfaces adjacent to each other (side surfaces perpendicular to each other) 512 and 518. For example, the liquid material flow path 520 is extended to penetrate the inside of the vaporization module 510 in an L shape. The penetration of the liquid material flow path 520 through the two side surfaces 512 and 518 results in formation of openings 522 and 528. The side surfaces 512 and 518 serve as joint surfaces where the vaporization module 510 is closely connected to other vaporization modules to thereby form the vaporizer. It is preferable that the side surfaces 512 and 518 meet at a right angle.

Furthermore, although it is not shown, the flow paths other than the liquid material flow path 520 formed in the vaporization module, i.e., the carrier gas flow path and the source gas flow path, which penetrate the same side surfaces 512 and 518 of the vaporization module 510 in an "L" shape respectively as same as the liquid material flow path 520.

Figure 15:
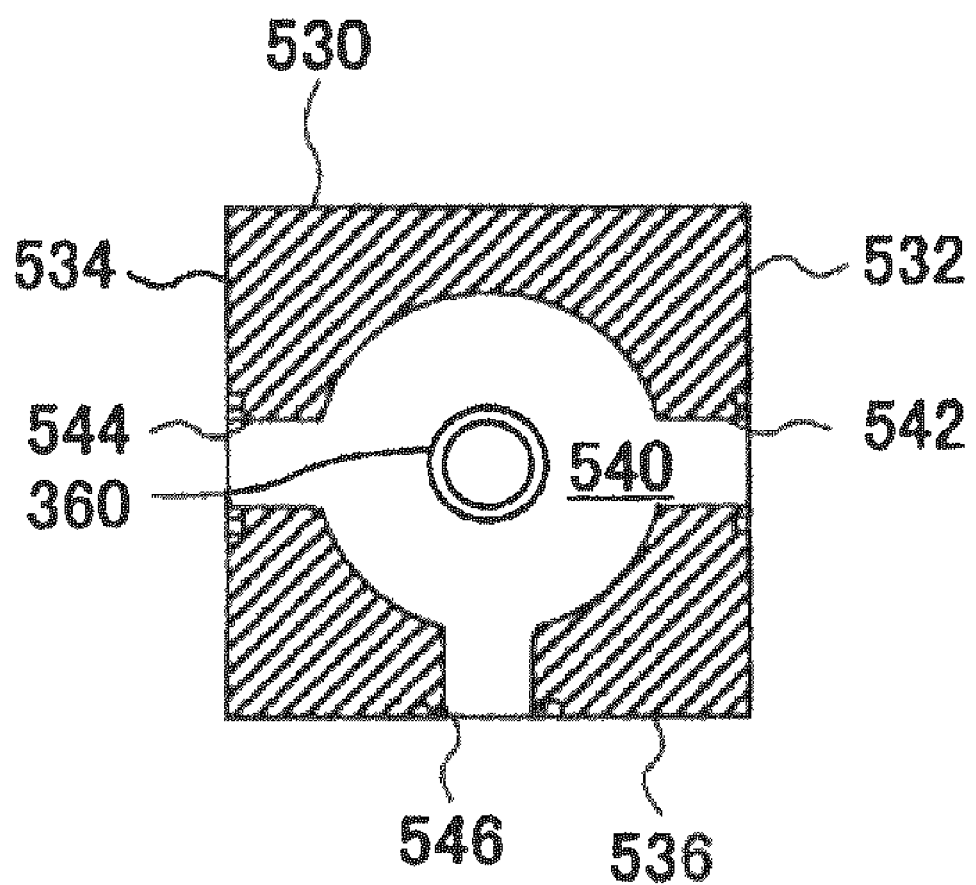
FIG. 15 illustrates a horizontal cross sectional view of a schematic configuration example of a vaporization module having a T-shaped flow path in accordance with the fourth embodiment.

Hereinafter, configuration examples of the vaporization modules 530A to 530C will be described with reference to the drawings. Since the configuration examples of the vaporization modules 530A to 530C have substantially the same configuration, the configuration example of the vaporization module 530 will be described representatively. FIG. 15 is a cross sectional view schematically showing the configuration example of the vaporization module 530 in accordance with the fourth embodiment, and illustrates a horizontal cross section of the liquid material flow path of the vaporization module 530 seen from the top.

The vaporization module 530 of FIG. 15 has the same configuration as that of the vaporization module 410 of FIG. 6 with respect to the inner components (e.g., spray nozzle, vaporization chamber, carrier gas injection unit and the like) and the block shape having a rectangular cross section, but is different therefrom in the configurations of the flow path, e.g., the liquid material flow path and the like. Specifically, the vaporization modules 530 of FIG. 15 is different from the vaporization module 310 of FIG. 6 in that the liquid material flow path 540 is extended to penetrate only three side surfaces 532, 534 and 536 adjacent to one another. For example, the liquid material flow path 540 is extended to penetrate the inside of the vaporization module 530 in a "T" shape. Each penetration of the carrier gas flow path 530 through the three side surfaces 532, 534 and 536 results in formation of openings 542, 544 and 546. The side surfaces 532, 534 and 536 serve as joint surface where the vaporization module 530 is connected to other vaporization modules. Preferably, the side surfaces 532 and 534 are disposed opposite to and parallel to each other, and the side surface 536 meets the side surfaces 532 and 534 at right angles.

Although it is not shown, the flow paths other than the liquid material flow path 540 formed in the vaporization module, i.e., the carrier gas flow path and the source gas flow path, penetrate the side surfaces 532, 534 and 536 of the vaporization module in a "T" shape as same as the liquid material flow path 540.

By connecting the vaporization modules 510A to 510D having the L-shaped flow paths, the vaporization modules 530A to 530C having the T-shaped flow paths, and the vaporization modules 410D and 410E having the above-described cross-shaped flow paths in a matrix pattern, the liquid material flow paths 520A to 520D, 540A to 540C, 420D and 420E communicate with each other. In the same manner, the carrier gas flow paths and the source gas flow paths communicate with each other. Accordingly, the vaporizer 500 in accordance with the fourth embodiment shown in FIG. 13 is obtained.

In the vaporizer 500 of FIG. 13 as similar to the vaporizer 400 of FIG. 11, the liquid material supply line 112, the carrier gas supply line 122 and the source gas supply line 132 are connected to the vaporization module 410D.

In the vaporizer 500 in accordance with the fourth embodiment, the liquid material flow path does not open at side surfaces that are not connected to other vaporization modules among the side surfaces of the vaporization modules, so that the end plates 390A and 390B become unnecessary. Further, the same effects as those of the vaporizer 400 in accordance with the third embodiment may be obtained.

(Modified Example of Vaporization Module)

Hereinafter, modified example of a vaporization module in accordance with the aforementioned embodiments of the present invention will be described with reference to the drawings. For example, the vaporization module 310 shown in FIGS. 4 to 6 can be replaced with the vaporization module 550 illustrated in FIG. 16.

The vaporization module 550 has the same configuration as that of the vaporization module 310 except that the internal heating unit 382 is removed from the vaporization chamber 370. For example, when a liquid source material exhibits high vaporization efficiency even at a comparatively low temperature, the vaporization module 550 shown in FIG. 16 may be employed. The omission of the internal heating unit 382 leads to a reduced product cost and the saving of power consumption.

Figure 16:
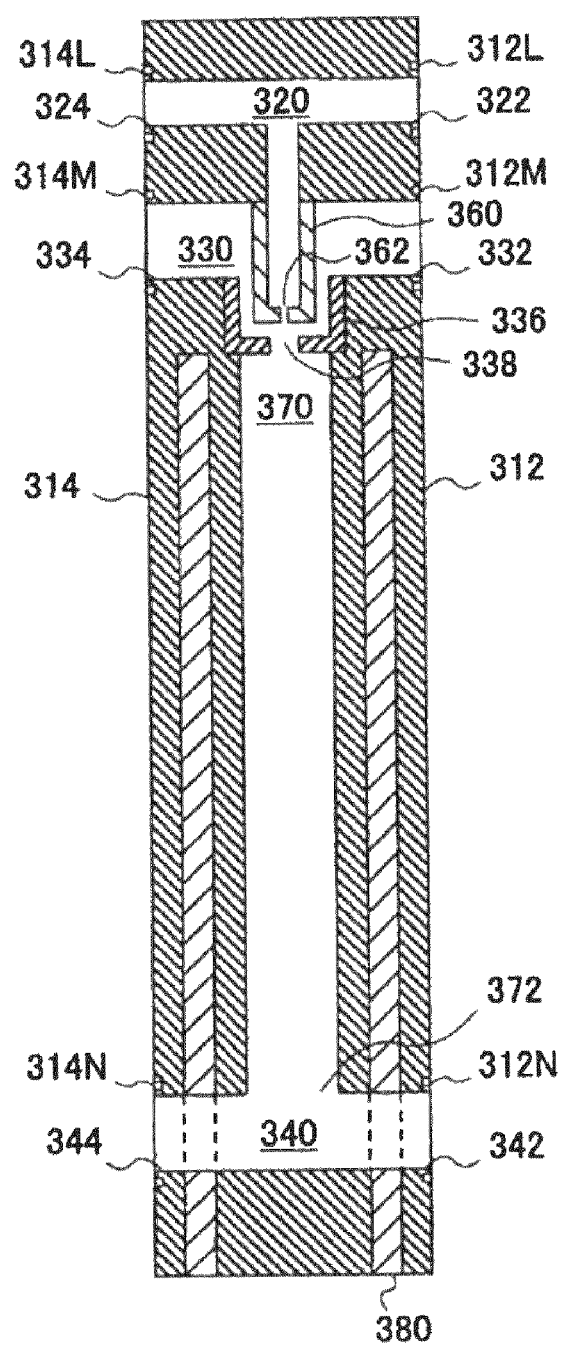
FIG. 16 sets forth a vertical cross sectional view of a schematic configuration example of a vaporization module than can be used instead of the vaporization module of FIG. 4.
Figure 17:
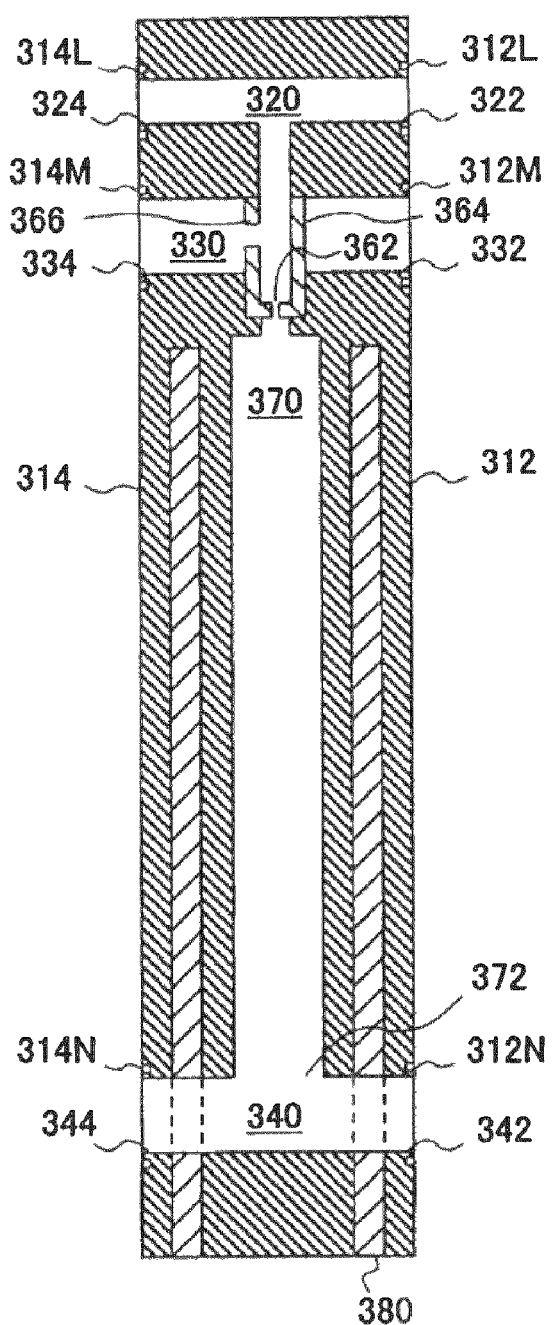
FIG. 17 shows a vertical cross sectional view of a schematic configuration example of a vaporization module than can be used instead of the vaporization module of FIG. 16.

Further, the vaporization module 560 of FIG. 17 may be employed instead of the vaporization module 550 of FIG. 16. The vaporization module 560 is different from the vaporization module 550 in the structure for mixing a liquid source material with a carrier gas. In other words, in the case of the vaporization module 550, the carrier gas injection opening 338 of the carrier gas injection unit 336 communicating with the carrier gas flow path 330 is disposed near the discharge opening 362 of the spray nozzle 360. The liquid source material is mixed with the carrier gas injected through the carrier gas injection opening 338 after being discharged through the discharge opening 362 of the spray nozzle 360. As such, the vaporization module 550 has a so-called post-mix structure in mixing the liquid source material and the carrier gas.

On the contrary, in the case of the vaporization module 560, the carrier gas inlet opening 366 is formed at the body of the spray nozzle 364, and the carrier gas flow path 330 communicates with the carrier gas inlet opening 366. Accordingly, the liquid source material is mixed with the carrier gas in the spray nozzle 364 and then is discharged through the discharge opening 362. As such, the vaporization module 560 has a so-called post-mix structure in mixing the liquid source material and the carrier gas.

Figure 18:
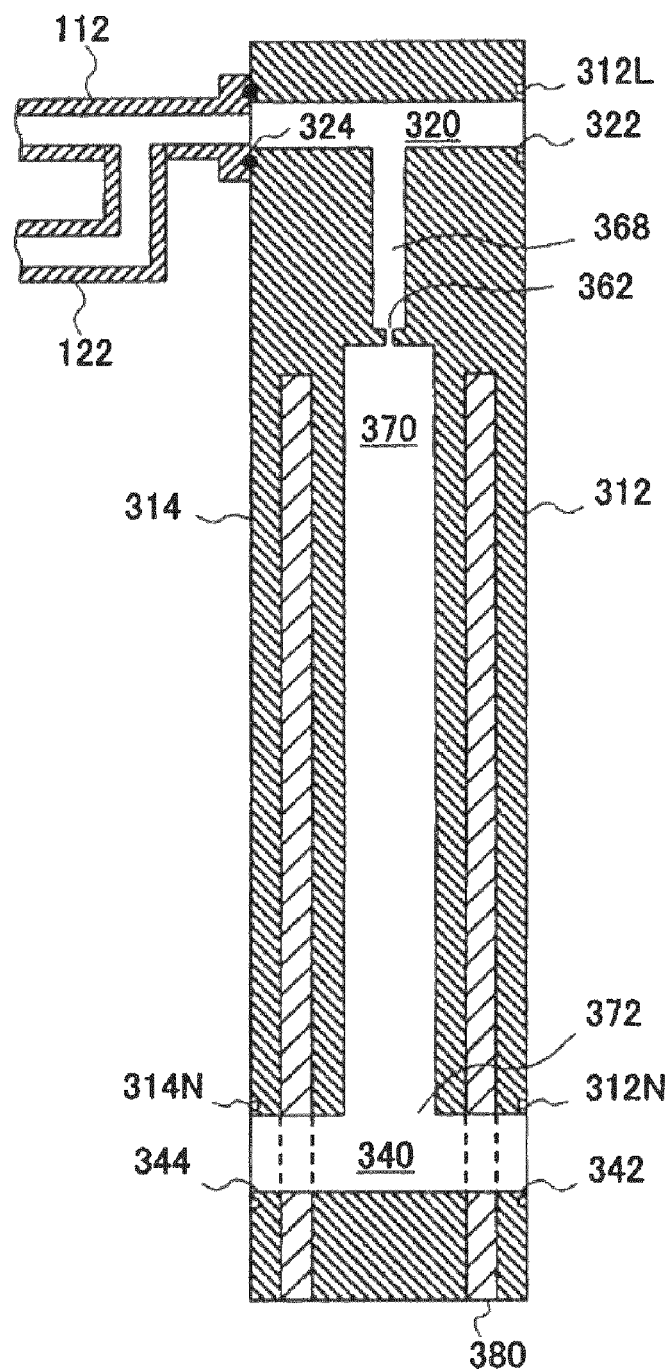
FIG. 18 presents a vertical cross sectional view of a schematic configuration example of a vaporization module than can be used instead of the vaporization module of FIG. 18.

In addition, the vaporization module 570 of FIG. 18 may be employed instead of the vaporization module 560 of FIG. 17. The vaporization module 570 as well as the vaporization module 560 has a so-called pre-mix structure for mixing a liquid source material and a carrier gas.

However, they are different from each other in the mixing position of a liquid source material and a carrier gas. The vaporization module 560 is configured to mix a liquid source material and a carrier gas in the spray nozzle 364 as described above. On the other hand, the vaporization module 570 is configured to mix a liquid source material with a carrier gas in advance outside the module and introduce the mixture into the module. Therefore, the carrier gas flow path is omitted in the vaporization module 570.

In the case of employing the vaporization module 570, the end portion of the carrier gas supply line 122 is connected to the liquid material supply line 112 by penetrating the line wall thereof. Accordingly, the liquid source material mixed with the carrier gas is supplied through the opening 324 of the liquid material flow path 320 to the liquid material flow path 320 in the vaporization module 570, and then sent to the discharge opening 362 via the liquid material discharge path 368 communicating with a middle portion of the liquid material flow path 320, and then injected into the vaporization chamber 370 through the discharge opening 362.

Further, the liquid material discharge path 368 in the vaporization module 570 is formed by machining, e.g., a block-shaped member. Instead of the liquid material discharge path 368, the spray nozzle 360 in accordance with the first embodiment can be assembled to the vaporization module 570.

The vaporization modules 550 to 570 shown in FIGS. 16 to 18 are selectively employed in accordance with, e.g., types of the liquid source material. In a vaporizer formed by connecting any vaporization modules, for example, even when a flow rate of the source gas required for film formation is changed, a source gas having a required flow rate can be generated by changing the number of vaporization modules without replacing the entire vaporizer as in the first to the fourth embodiment.

Moreover, as described in the detailed examples of the first to the fourth embodiment, the flow rate of the source gas in the entire vaporizer of the present invention corresponds to the number of vaporization modules of the vaporizer, so that the flow rate of the source gas in a single vaporization module does not need to be increased. As a consequence, the respective liquid material discharge openings of the vaporization modules can be minimized, so that the smaller liquid droplets of the liquid source material can be discharged through the discharge openings. Accordingly, the vaporization efficiency of a single vaporization module can be further improved and, further, the vaporization efficiency of the entire vaporizer can be increased.

Further, as the size of the liquid droplets of the liquid material source discharged from the discharge opening decreases, the size of the longitudinal direction of the vaporization chamber can be reduced, which makes a single vaporization module compact. Accordingly, the entire vaporizer can be configured more compactly.

While the present invention has been shown and described with respect to the embodiments with reference to the drawings, it will be understood by those skilled in the art that various changes and modification may be made without departing from the scope of the invention as defined in the following claims.

For example, the present invention can be applied to a vaporizer, a vaporization module used in a film forming apparatus such as a MOCVD apparatus, a plasma CVD apparatus, an ALD (atomic layer deposition) apparatus, an LP-CVD (batch type, vertical type, horizontal type, and mini-batch type) apparatus or the like.

Industrial Applicability

The present invention can be applied to a vaporizer for generating a source gas by vaporizing a liquid source material, a vaporization module of the vaporizer, and a film forming apparatus including the vaporizer.

What is claimed is:

1. A vaporizer for a film forming apparatus comprising a plurality of vaporization modules for generating a source gas by vaporizing a liquid source material, the vaporizer being formed by connecting the vaporization modules, wherein each of the vaporization modules includes:
   a discharge opening for discharging the liquid source material;
   a vaporization chamber for generating the source gas by vaporizing the liquid source material discharged through the discharge opening;
   a liquid material flow path extended to penetrate joint surfaces adapted to be connected to at least other vaporization modules; and
   a discharge path communicating with a portion of the liquid material flow path, for directing the liquid material flowing in the liquid material flow path to the discharge opening,
   wherein the vaporization modules are connected to one another at the joint surfaces so that liquid material flow paths of the vaporization modules communicate with each other.

2. The vaporizer of claim 1, wherein each of the vaporization modules has a rectangular cross section and side surfaces serving as the joint surfaces adapted to be connected to other vaporization modules, and the liquid material flow path of each of the vaporization modules is extended to penetrate a pair of the joint surfaces parallel to each other.

3. The vaporizer of claim 2, wherein the liquid material flow paths of the vaporization modules communicate linearly with each other by connecting the vaporization modules in a single row, and an upstream opening of the liquid material flow path of the first vaporization module is connected to a liquid material supply source and a downstream opening of the liquid material flow path of the last vaporization module is blocked.

4. The vaporizer of claim 2, wherein the vaporization modules are connected in a plurality of rows, and the liquid material flow paths of the vaporization modules in each of the rows communicate linearly with each other,
   wherein the first vaporization modules in the respective rows are connected to a flow path block having a flow path for dividing the liquid source material from a liquid material supply source into plural flows corresponding the number of the rows, and
   wherein the liquid source material is supplied to upstream openings of the liquid material flow paths of the first vaporization modules in the respective rows via the flow path of the flow path block, and downstream openings of the liquid material flow paths of the last vaporization modules in the respective rows are blocked.

5. The vaporizer of claim 1, wherein each of the vaporization modules has a rectangular cross section and side surfaces serving as the joint surfaces adapted to be connected to other vaporization modules, and the liquid material flow path of each of the vaporization modules is extended to penetrate at least two adjacent joint surfaces.

6. The vaporizer of claim 5, wherein the liquid material flow paths of the vaporization modules are extended to penetrate all the joint surfaces and communicate with each other in a row direction and a column direction perpendicular thereto by connecting the vaporization modules in the row direction as well as in the column direction, and
   wherein the liquid material supply source is connected to any one of openings of the liquid material flow paths which open at the joint surfaces that are not connected to other vaporization modules, and the other openings of the liquid material flow paths are blocked.

7. The vaporizer of claim 6, wherein the vaporization modules are connected in the row and the column direction in a matrix pattern.

8. The vaporizer of claim 5, wherein the vaporization modules are connected in a row direction and a column direction in a matrix pattern, and the liquid material flow paths of the vaporization modules are extended to penetrate the joint surfaces connected to other vaporization modules.

9. A vaporizer for a film forming apparatus comprising a plurality of block-shaped vaporization modules for generating a source gas by vaporizing a liquid source material, the vaporizer being formed by connecting the vaporization modules, wherein each of the vaporization modules includes:
   a liquid material flow path extended to penetrate joint surfaces adapted to be connected to at least other vaporization modules and a source gas flow path extended to penetrate the joint surfaces;
   a vaporization chamber provided between the liquid material flow path and the source gas flow path, the vaporization chamber being elongated longitudinally in a direction perpendicular to the flow paths;

a discharge opening provided at one end of the vaporization chamber, for discharging the liquid material flowing in the liquid material flow path toward the vaporization chamber; and a source gas outlet provided at the other end of the vaporization chamber, for discharging the source gas generated by vaporizing the liquid source material discharged through the discharge opening to the source gas flow path, wherein the vaporization modules are connected to one another at the joint surfaces so that the liquid material flow paths of the vaporization modules communicate with each other.

10. The vaporizer of claim 1 or 9, wherein each of the vaporization modules includes a carrier gas flow path where a carrier gas injected toward the vaporization chamber flows together with the liquid source material discharged through the discharge opening, and wherein the carrier gas flow paths of the vaporization modules are extended to penetrate the joint surfaces through which the liquid material flow paths penetrate, and the carrier gas flow paths as well as the liquid material flow paths of the vaporization modules communicate with each other by connecting the vaporization modules to one another at the joint surfaces.

11. The vaporizer of claim 10, wherein each of the vaporization modules includes a carrier gas injection opening for injecting the carrier gas from the carrier gas flow path, and the discharge opening is disposed within the carrier gas injection opening having a diameter larger than a diameter of the discharge opening.

12. The vaporizer of claim 10, wherein the carrier gas flow path communicates with the discharge flow path, and the carrier gas is mixed with the liquid source material in the discharge flow path to be discharged through the discharge opening toward the vaporization chamber.

13. The vaporizer of claim 1 or 9, wherein the liquid source material which is mixed with the carrier gas flows in the liquid material flow path of each of the vaporization modules.

14. The vaporizer of claim 1 or 9, wherein in each of the vaporization modules, a heating unit for heating the vaporization chamber is provided in the sidewall of the vaporization chamber.

15. The vaporizer of claim 1 or 9, wherein in each of the vaporization modules, a heating unit for heating the vaporization chamber is provided in the vaporization chamber.

16. A vaporization module in a vaporizer for a film forming apparatus formed by connecting a plurality of block-shaped vaporization modules for generating a source gas by vaporizing a liquid source material, the vaporization module comprising:

a discharge opening for discharging the liquid source material;

a vaporization chamber for generating the source gas by vaporizing the liquid source material discharged through the discharge opening;

a liquid material flow path extended to penetrate joint surfaces adapted to be connected to at least other vaporization modules; and a discharge path communicating with a portion of the liquid material flow path, for directing the liquid material flowing in the liquid material flow path to the discharge opening.

17. The vaporization module of claim 16, wherein each of the vaporization modules has a rectangular cross section and side surfaces serving as the joint surfaces adapted to be connected to other vaporization modules, and the liquid material flow path of each of the vaporization modules is extended to penetrate a pair of the joint surfaces parallel to each other.

18. The vaporization module of claim 16, wherein each of the vaporization modules has a rectangular cross section and side surfaces serving as the joint surfaces adapted to connected to other vaporization modules, and the liquid material flow path of each of the vaporization modules is extended to penetrate at least two adjacent joint surfaces.

19. The vaporization module of claim 16, further comprising a source gas flow path in which the source gas generated in the vaporization chamber flows, wherein the source gas flow path is extended to penetrate the joint surfaces through which the liquid material flow path penetrates.

20. The vaporization module of claim 19, wherein the vaporization chamber is provided between the liquid material flow path and the source gas flow path, the vaporization chamber being elongated longitudinally in a direction perpendicular to the flow paths, wherein the discharge opening is disposed at one end side of the vaporization chamber, and a source gas outlet for discharging the source gas generated in the vaporization chamber to the source gas flow path is formed at the other end side of the vaporization chamber.

21. The vaporization module of claim 16, further comprising a carrier gas flow path where a carrier gas injected toward the vaporization camber flows together with the liquid source material discharged through the discharge opening, wherein the carrier gas flow path is extended to penetrate the joint surfaces through which the liquid material flow path penetrates.

22. A film forming apparatus comprising:

a vaporizer for generating a source gas by vaporizing a liquid source material introduced via a liquid material flow path; and a film forming chamber for forming a film on a target substrate by using the source gas introduced from the vaporizer, wherein the vaporizer is formed by connecting a plurality of block-shaped vaporization modules, and each of the vaporization modules includes:

a liquid material flow path extended to penetrate joint surfaces adapted to be connected to at least other vaporization modules;

a source gas flow path extended to penetrate the joint surfaces;

a vaporization chamber provided between the liquid material flow path and the source gas flow path;

a discharging opening provided at one end side of the vaporization chamber, for discharging the liquid material source flowing in the liquid material flow path toward the vaporization chamber; and a source gas outlet for discharging the source gas generated by vaporizing the liquid source material discharged through the discharge opening to the source gas flow path, wherein the vaporization modules are connected to one another at the joint surfaces so that the liquid material flow paths communicate with each other to form the liquid material flow path of the vaporizer.

* * * * *